US012668484B2

(12) United States Patent
Chen

(10) Patent No.: US 12,668,484 B2
(45) Date of Patent: Jun. 30, 2026

(54) MICROELECTROMECHANICAL SYSTEMS DEVICE HAVING IMPROVED SIGNAL DISTORTION

(71) Applicant: Taiwan Semiconductor Manufacturing Company, Ltd., Hsinchu (TW)

(72) Inventor: Ting-Jung Chen, Kaohsiung City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 897 days.

(21) Appl. No.: 17/376,580

(22) Filed: Jul. 15, 2021

(65) Prior Publication Data

US 2023/0015144 A1      Jan. 19, 2023

(51) Int. Cl.
*B81B 3/00* (2006.01)
*B81C 1/00* (2006.01)

(52) U.S. Cl.
CPC ........ *B81B 3/0021* (2013.01); *B81C 1/00158* (2013.01); *B81B 2201/0257* (2013.01); *B81B 2201/032* (2013.01); *B81B 2203/0127* (2013.01); *B81B 2203/0145* (2013.01); *B81B 2203/0163* (2013.01); *B81B 2203/019* (2013.01); *B81B 2203/0315* (2013.01)

(58) Field of Classification Search
CPC .......... B81B 3/0021; B81B 2201/0257; B81B 2201/032; B81B 2203/0127; B81B 2203/0145; B81B 2203/0163; B81B 2203/019; B81B 2203/0315; B81C 1/00158

See application file for complete search history.

(56) References Cited

U.S. PATENT DOCUMENTS

| | | | | |
|---|---|---|---|---|
| 2012/0090398 A1* | 4/2012 | Lee | ...................... | H04R 19/005 |
| | | | | 73/715 |
| 2014/0084396 A1 | 3/2014 | Jenkins et al. | | |
| 2016/0031700 A1 | 2/2016 | Sparks et al. | | |
| 2016/0360322 A1 | 12/2016 | Liu et al. | | |
| 2018/0091906 A1 | 3/2018 | Khenkin et al. | | |
| 2020/0382876 A1* | 12/2020 | Cerini | ................... | H04R 17/02 |
| 2020/0411749 A1 | 12/2020 | Chen | | |
| 2021/0061647 A1 | 3/2021 | Chen et al. | | |
| 2021/0078042 A1 | 3/2021 | Bircumshaw et al. | | |
| 2021/0204068 A1 | 7/2021 | Wang et al. | | |
| 2022/0315412 A1* | 10/2022 | Liang | ................... | B81B 3/0021 |
| 2022/0332568 A1* | 10/2022 | Barsukou | .............. | B81B 3/0021 |

* cited by examiner

*Primary Examiner* — Marcos D. Pizarro

(74) *Attorney, Agent, or Firm* — Eschweiler & Potashnik, LLC

(57) ABSTRACT

Various embodiments of the present disclosure are directed towards a semiconductor device. The semiconductor device comprises a substrate. A cavity is disposed in the substrate. A microelectromechanical system (MEMS) layer is disposed over the substrate. The MEMS layer comprises a movable diaphragm disposed over the cavity. The movable diaphragm comprises a central region and a peripheral region. The movable diaphragm is flat in the central region of the movable diaphragm. The movable diaphragm is corrugated in the peripheral region of the movable diaphragm.

20 Claims, 10 Drawing Sheets

700

702   702        702   702

104f

104

104b

800

702   702        702   702

104f

110

104

104b

1900 ➘

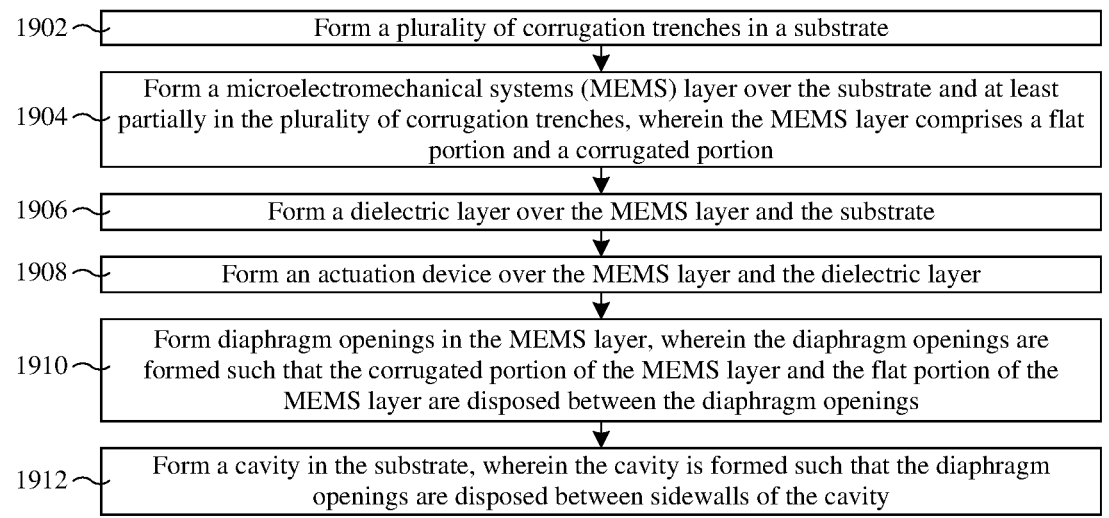

1902 ⌇ Form a plurality of corrugation trenches in a substrate

1904 ⌇ Form a microelectromechanical systems (MEMS) layer over the substrate and at least partially in the plurality of corrugation trenches, wherein the MEMS layer comprises a flat portion and a corrugated portion 1906 ⌇ Form a dielectric layer over the MEMS layer and the substrate 1908 ⌇ Form an actuation device over the MEMS layer and the dielectric layer 1910 ⌇ Form diaphragm openings in the MEMS layer, wherein the diaphragm openings are formed such that the corrugated portion of the MEMS layer and the flat portion of the MEMS layer are disposed between the diaphragm openings 1912 ⌇ Form a cavity in the substrate, wherein the cavity is formed such that the diaphragm openings are disposed between sidewalls of the cavity

Fig. 19

MICROELECTROMECHANICAL SYSTEMS DEVICE HAVING IMPROVED SIGNAL DISTORTION

BACKGROUND

Microelectromechanical systems (MEMS) is a technology that integrates miniaturized mechanical and electromechanical elements on an integrated chip. MEMS devices are often made using micro-fabrication techniques. In recent years, MEMS devices have found a wide range of applications. For example, MEMS devices are found in cell phones (e.g., accelerometers, gyroscopes, digital compasses), speakers, microphones, pressure sensors, micro-fluidic elements (e.g., valves, pumps), optical switches (e.g., mirrors), imaging devices (e.g., micromachined ultrasonic transducers (MUTs)), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 19 illustrates a flowchart of some embodiments of a method for forming a semiconductor device with improved signal distortion.

DETAILED DESCRIPTION

Figure 1:
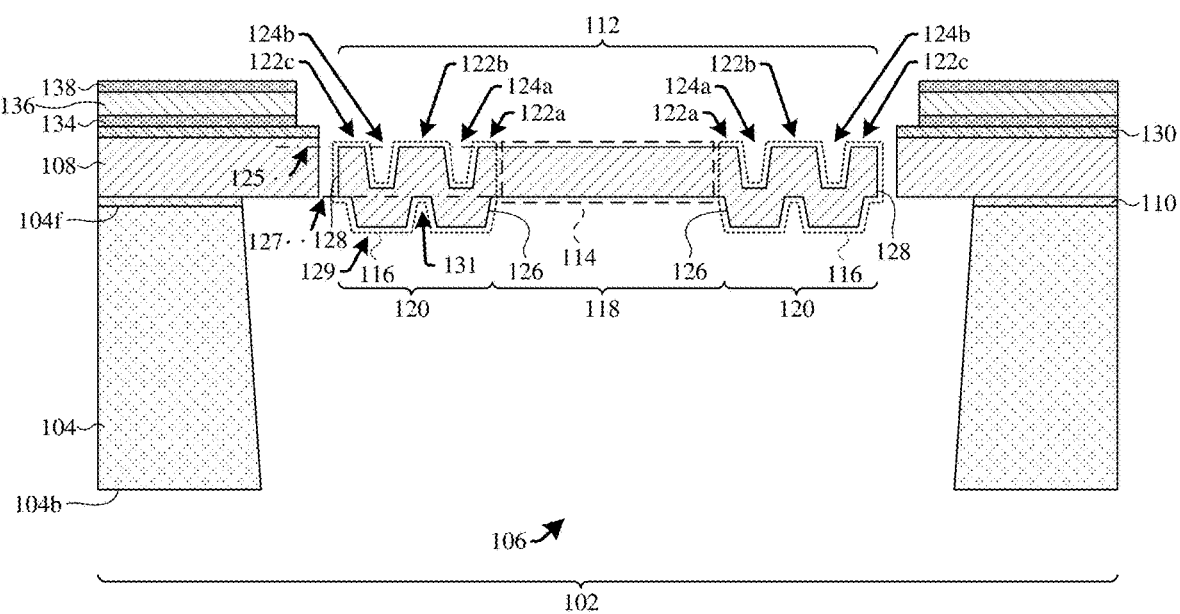
FIG. 1 illustrates a cross-sectional view of some embodiments of a semiconductor device having improved signal distortion

The present disclosure will now be described with reference to the drawings wherein like reference numerals are used to refer to like elements throughout, and wherein the illustrated structures are not necessarily drawn to scale. It will be appreciated that this detailed description and the corresponding figures do not limit the scope of the present disclosure in any way, and that the detailed description and figures merely provide a few examples to illustrate some ways in which the inventive concepts can manifest themselves.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some embodiments, an integrated chip comprises a microelectromechanical systems (MEMS) device (e.g., MEMS speaker). The MEMS speaker comprises a substrate and a MEMS layer disposed over the substrate. A cavity is disposed in the substrate. The MEMS layer comprises a movable diaphragm overlying the cavity. Typically, the movable diaphragm is a flat movable diaphragm (e.g., the movable diaphragm is flat across the entirety of the movable diaphragm). An actuation device (e.g., a piezoelectric device) is configured to displace the movable diaphragm in response to electrical signals, thereby causing the MEMS speaker to output a range of sounds (e.g., between about 20 hertz (Hz) and about 20,000 Hz). For example, for the MEMS speaker to output the range of sounds, the actuation device applies a force to the flat movable diaphragm at different frequencies to oscillate the flat movable diaphragm at corresponding frequencies.

One challenge with the MEMS speaker is signal distortion (e.g., audio distortion). The flat movable diaphragm is one source of audio distortion (e.g., distortion of the sound output by the MEMS speaker). The flat movable diaphragm causes the audio distortion (e.g., non-flat frequency response) due to the shape of the flat movable diaphragm causing resonate distortion in the high frequency range (e.g., between about 1,000 Hz and about 20,000 Hz). For example, for the MEMS speaker to output the range of sounds at a given output level (e.g., 65 dB), the applied force needs to oscillate the flat movable diaphragm with a same amplitude across the corresponding frequencies. In other words, if the applied force causes the flat movable diaphragm to oscillate at different amplitudes across the corresponding frequencies, the MEMS speaker will undesirably output the range of sounds at different output levels, thereby resulting in audio distortion.

More specifically, when outputting a specific sound (e.g., a sound in the high frequency range), the actuation device provides a force periodically to the flat movable diaphragm that oscillates the flat movable diaphragm at a specific frequency, such that the MEMS speaker outputs the specific sound. Due to the shape of the flat movable diaphragm, the specific frequency is equal to or close to the natural frequency of the flat movable diaphragm. Therefore, when the oscillating force is applied to the flat movable diaphragm at the specific frequency, the flat movable diaphragm will oscillate at a higher amplitude (e.g., due to constructive interference) than when the same force is applied to the flat movable diaphragm at other frequencies (e.g., frequencies below about 1,000 Hz). Thus, due to the shape of the flat movable diaphragm, the MEMS speaker may have poor audio distortion (e.g., high audio distortion) in the high frequency range.

Various embodiments of the present application are directed toward a semiconductor device (e.g., MEMS speaker) with improved (e.g., reduced) signal distortion (e.g., audio distortion). The semiconductor device comprises a cavity disposed in a substrate. A MEMS layer is disposed over the substrate. The MEMS layer comprises a movable diaphragm disposed over the cavity. The movable diaphragm comprises a central region and a peripheral region. The movable diaphragm is flat in the central region of the movable diaphragm, and the movable diaphragm is corrugated in the peripheral region of the movable diaphragm.

The corrugated portion of the movable diaphragm acts as a dampening element that reduces and/or restricts the oscillations of the flat portion of the movable diaphragm. Because the corrugated portion of the movable diaphragm acts as the dampening element, the corrugated portion of the movable diaphragm may reduce variations in the amplitude of the flat portion of the movable diaphragm across a range of frequencies at which the flat movable diaphragm is driven (e.g., via an actuation device). Accordingly, the semiconductor device (e.g., MEMS speaker) of the present application may have improved (e.g., reduced) signal distortion (e.g., audio distortion) in a high frequency range (e.g., between about 1,000 Hz and about 20,000 Hz).

FIG. 1 illustrates a cross-sectional view 100 of some embodiments of a semiconductor device 102 having improved signal distortion.

As shown in the cross-sectional view 100 of FIG. 1, the semiconductor device 102 (e.g., a microelectromechanical systems (MEMS) device) comprises a substrate 104. The substrate 104 comprises any type of semiconductor body (e.g., monocrystalline silicon/CMOS bulk, germanium (Ge), silicon-germanium (SiGe), gallium arsenide (GaAs), silicon on insulator (SOI), etc.). The substrate 104 may be doped (e.g., with n-type or p-type dopants) or undoped (e.g., intrinsic). In some embodiments, the substrate 104 may be referred to as a semiconductor substrate 104. The substrate 104 has a back-side 104$b$ and a front-side 104$f$ that is opposite the back-side 104$b$ of the substrate 104.

A cavity 106 is disposed in the substrate 104. The cavity 106 extends into the substrate 104 from the back-side 104$b$ of the substrate 104. In some embodiments, the cavity 106 has angled sidewalls. In such embodiments, an angle between the sidewalls of the cavity 106 and the back-side 104$b$ of the substrate may be obtuse or acute. In other embodiments, the sidewalls of the cavity 106 may be substantially vertically (e.g., extend from the back-side 104$b$ of the substrate 104 at a substantially right angle). In some embodiments, the sidewalls of the cavity 106 may be substantially straight. In other embodiments, the sidewalls of the cavity 106 may be rounded.

A microelectromechanical systems (MEMS) layer 108 is disposed over the front-side 104$f$ of the substrate 104. The MEMS layer 108 may be or comprises, for example, a semiconductor material (e.g., polysilicon, amorphous silicon, monocrystalline silicon, SiGe, Ge, or the like), a metal (e.g., aluminum (Al), copper (Cu), aluminum copper (AlCu)), an oxide (e.g., silicon dioxide (SiO$_2$)), a nitride (e.g., silicon nitride (SiN)), an oxy-nitride (e.g., silicon oxy-nitride (SiO$_X$N$_Y$)), some other material suitable as a MEMS layer, or a combination of the foregoing. In some embodiments, the MEMS layer 108 is polysilicon.

In some embodiments, a first dielectric layer 110 is disposed between the MEMS layer 108 and the substrate 104. In other embodiments, the first dielectric layer 110 is omitted. The first dielectric layer 110 may be or comprise, for example, an oxide (e.g., SiO$_2$), a nitride (e.g., SiN), an oxy-nitride (e.g., SiO$_X$N$_Y$), some other dielectric material, or a combination of the foregoing. In some embodiments, the first dielectric layer 110 is silicon dioxide (SiO$_2$).

The MEMS layer 108 comprises a movable diaphragm 112. The movable diaphragm 112 comprises a flat portion 114 of the MEMS layer 108 and a corrugated portion 116 of the MEMS layer 108. The flat portion 114 of the MEMS layer 108 is disposed in a central region 118 of the movable diaphragm 112. In some embodiments, the flat portion 114 of the MEMS layer 108 is referred to as the flat portion 114 of the movable diaphragm 112 (e.g., because the movable diaphragm 112 comprises the flat portion 114 of the MEMS layer 108).

The corrugated portion 116 of the MEMS layer 108 is disposed in a peripheral region 120 of the movable diaphragm 112. In some embodiments, the corrugated portion 116 of the MEMS layer 108 is referred to as the corrugated portion 116 of the movable diaphragm 112 (e.g., because the movable diaphragm 112 comprises the corrugated portion 116 of the MEMS layer 108). In some embodiments, the peripheral region 120 of the movable diaphragm 112 laterally surrounds the central region 118 of the movable diaphragm 112. In such embodiments, the peripheral region 120 of the movable diaphragm 112 may extend laterally around the central region 118 of the movable diaphragm 112 in a closed loop path. In other embodiments, the peripheral region 120 of the movable diaphragm 112 comprises a first portion and a second portion that are disposed on opposite sides of the central region 118 of the movable diaphragm 112.

In some embodiments, the flat portion 114 of the MEMS layer 108 defines the central region 118 of the movable diaphragm 112. In other words, boundaries of the flat portion 114 of the MEMS layer 108 define boundaries of the central region 118 of the movable diaphragm 112. In further embodiments, the corrugated portion 116 of the MEMS layer 108 defines the peripheral region 120 of the movable diaphragm 112. In other words, boundaries of the corrugated portion 116 of the MEMS layer 108 define boundaries of the peripheral region 120 of the movable diaphragm 112. For example, in embodiments in which the flat portion 114 of the MEMS layer 108 defines the central region 118 of the movable diaphragm 112, the corrugated portion 116 of the MEMS layer 108 defines the peripheral region 120 of the movable diaphragm 112, and the peripheral region 120 of the movable diaphragm 112 laterally surrounds the central region 118 of the movable diaphragm 112, the corrugated portion 116 of the MEMS layer 108 laterally surrounds the flat portion 114 of the MEMS layer 108.

The flat portion 114 of the MEMS layer 108 has an upper surface and a bottom surface. The upper surface and the bottom surface of the flat portion 114 of the MEMS layer 108 both extend continuously between opposite sides of the corrugated portion 116 of the MEMS layer 108. In some embodiments, the bottom surface and the upper surface of the flat portion 114 of the MEMS layer 108 are substantially planar.

In some embodiments, an inner boundary of the corrugated portion 116 of the MEMS layer 108 is defined by a point in which a bottom surface 126 of the MEMS layer 108 extends at an angle from the bottom surface of the flat portion 114 of the MEMS layer 108. In other words, the point in which the bottom surface 126 of the MEMS layer 108 extends at the angle from the bottom surface of the flat portion 114 of the MEMS layer 108 defines the point in which the flat portion 114 of the MEMS layer 108 ends and the corrugated portion 116 of the MEMS layer 108 begins. In some embodiments, the bottom surface 126 of the MEMS layer 108 is angled, as shown in the cross-sectional view 100 of FIG. 1. In other embodiments, the bottom surface 126 of the MEMS layer 108 is substantially vertical. In some embodiments, the bottom surface 126 of the MEMS layer 108 is referred to as a bottom surface 126 of the movable diaphragm 112.

The corrugated portion 116 of the MEMS layer 108 comprises one or more ridges 122 and one or more grooves 124. For example, the corrugated portion 116 of the MEMS layer 108 comprises a first ridge 122a, a second ridge 122b, a third ridge 122c, a first groove 124a, and a second groove 124b. The one or more ridges 122 and the one or more grooves 124 alternate from the flat portion 114 of the MEMS layer 108 to first outer sidewalls 128 of the movable diaphragm 112. For example, the first ridge 122a is disposed nearest the flat portion 114 of the MEMS layer 108, the third ridge 122c is disposed nearest the first outer sidewalls 128 of the movable diaphragm 112, the second ridge 122b is disposed between the first ridge 122a and the third ridge 122c, the first groove 124a is disposed between (e.g., directly between) the first ridge 122a and the second ridge 122b, and the second groove 124b is disposed between (e.g., directly between) the second ridge 122b and the third ridge 122c. In some embodiments, peaks or upper surfaces of the one or more ridges 122 are substantially planar and are co-planar with the upper surface of the flat portion 114 (see line 125). Inverted ridges 129 and inverted grooves 131 can also be present, and the inverted grooves 131 can be flat upper surfaces that are co-planar with a surface of the substrate (see line 127).

In some embodiments, a second dielectric layer 130 is disposed over the MEMS layer 108. The second dielectric layer 130 may be or comprise, for example, an oxide (e.g., $SiO_2$), a nitride (e.g., SiN), an oxy-nitride (e.g., $SiO_XN_Y$), some other dielectric material, or a combination of the foregoing. In some embodiments, the second dielectric layer 130 is silicon dioxide ($SiO_2$). In further embodiments, the first dielectric layer 110 and the second dielectric layer 130 comprise a same material (e.g., $SiO_2$).

One or more actuation devices 132 are disposed over the MEMS layer 108. The actuation device 132 is configured to displace the movable diaphragm 112 in response to receiving electrical signal(s). More specifically, in some embodiments, the semiconductor device 102 is a MEMS speaker. In such embodiments, the actuation device 132 is configured to displace the movable diaphragm in response to receiving the electrical signals, thereby causing the movable diaphragm 112 to output acoustic waves (e.g., sounds). In other words, the actuation device 132 is configured to displace the movable diaphragm 112 in response to receiving the electrical signals, thereby causing the semiconductor device 102 to output a range of sounds (e.g., between about 20 hertz (Hz) and about 20,000 Hz). For example, for the semiconductor device 102 to output the range of sounds, the actuation device 132 applies a force to the movable diaphragm 112 at different frequencies to oscillate the movable diaphragm 112 at corresponding frequencies.

The corrugated portion 116 of the MEMS layer 108 acts as a dampening element that reduces and/or restricts the oscillations of the flat portion 114 of the MEMS layer 108. Because the corrugated portion 116 of the MEMS layer 108 acts as the dampening element, the corrugated portion 116 of the MEMS layer 108 may reduce variations in the amplitude of the flat portion 114 of the MEMS layer 108 across a range of frequencies at which the movable diaphragm 112 is driven (e.g., driven via the actuation device 132). Accordingly, because the semiconductor device 102 (e.g., MEMS speaker) comprises the movable diaphragm 112, the semiconductor device 102 may have good signal distortion (e.g., low audio distortion) in a high frequency range (e.g., between about 1,000 Hz and about 20,000 Hz).

In some embodiments, the actuation device 132 is a piezoelectric actuation device, as shown in the cross-sectional view 100 of FIG. 1. In such embodiments, the actuation device 132 comprises a lower electrode 134, a piezoelectric structure 136 overlying the lower electrode 134, and an upper electrode 138 overlying the piezoelectric structure 136. The lower electrode 134 may be or comprise, for example, platinum (Pt), titanium (Ti), copper (Cu), gold (Au), aluminum (Al), zinc (Zn), tin (Sn), some other conductive material, or a combination of the foregoing. The piezoelectric structure 136 may comprise, for example, lead zirconate titanate (PZT), zinc oxide (ZnO), barium titanate ($BaTiO_3$), potassium niobate ($KNbO_3$), sodium-tungsten-oxide ($Na_2WO_3$), barium-sodium-niobium-oxide ($Ba_2NaNb_5O_5$), lead-potassium-niobium-oxide ($Pb_2KNb_5O_{15}$), langasite ($La_3Ga_5SiO_{14}$), gallium phosphate ($GaPO_4$), lithium-niobium-oxide ($LiNbO_3$), lithium tantalate ($LiTaO_3$), some other piezoelectric material, or a combination of the foregoing. The upper electrode 138 may be or comprise, for example, platinum (Pt), titanium (Ti), copper (Cu), gold (Au), aluminum (Al), zinc (Zn), tin (Sn), some other conductive material, or a combination of the foregoing. In some embodiments, the lower electrode 134 and the upper electrode 138 comprise a same material (e.g., Pt). While the cross-sectional view 100 of FIG. 1 illustrates the actuation device 132 as a piezoelectric actuation device, it will be appreciated that the semiconductor device 102 may comprise other types of actuation devices (e.g., electrostatic actuators, thermal actuations, magnetic actuators, etc.) that are configured to displace the movable diaphragm 112.

In some embodiments, the actuation device 132 may laterally surround the movable diaphragm 112, as shown in the cross-sectional view 100 of FIG. 1. In such embodiments, the lower electrode 134, the piezoelectric structure 136, and/or the upper electrode 138 may laterally surround the movable diaphragm 112. In further embodiments, the actuation device 132 has a ring-like shaped layout (e.g., a rectangular ring-like shape, a square ring-like shape, a circular ring-like shape, an elliptical ring-like shape, etc). In such embodiments, the lower electrode 134, the piezoelectric structure 136, and/or the upper electrode 138 may have the ring-like shaped layout. In some embodiments, the lower electrode 134 extends laterally around the movable diaphragm 112 in a closed loop path. In further embodiments, the upper electrode 138 extends laterally around the movable diaphragm 112 in a closed loop path. In yet further embodiments, piezoelectric structure 136 extends laterally around the movable diaphragm 112 in a closed loop path. In other embodiments, the piezoelectric structure 136 may comprise a plurality of discrete piezoelectric structures that are disposed laterally around the movable diaphragm 112. In such embodiments, the lower electrode 134 and the upper electrode 138 may contact each of the plurality of discrete piezoelectric structures and extend laterally around the movable diaphragm 112 in closed loop paths.

In some embodiments, the actuation device 132 overlies a first portion of the MEMS layer 108 and a second portion of the MEMS layer 108. The first portion of the MEMS layer 108 overlies the substrate 104. The second portion of the MEMS layer 108 overlies the cavity 106 and is disposed between the movable diaphragm 112 and the first portion of the MEMS layer 108. As such, the first portion of the MEMS layer 108 is more rigid than the second portion of the MEMS layer 108. Accordingly, by applying a voltage across the piezoelectric structure 136, the piezoelectric structure 136 can be deflected, thereby displacing (e.g., oscillating) the movable diaphragm 112. In some embodiments, the first portion of the MEMS layer 108 may be referred to as a "fixed" portion of the MEMS layer 108 (e.g., due to the first portion of the MEMS layer 108 being relatively inflexible), and the second portion of the MEMS layer 108 may be referred to as a "flexible" portion of the MEMS layer 108 (e.g., due to the second portion of the MEMS layer 108 being able to be displaced (e.g., flexed) by the actuation device 132).

Figure 2:
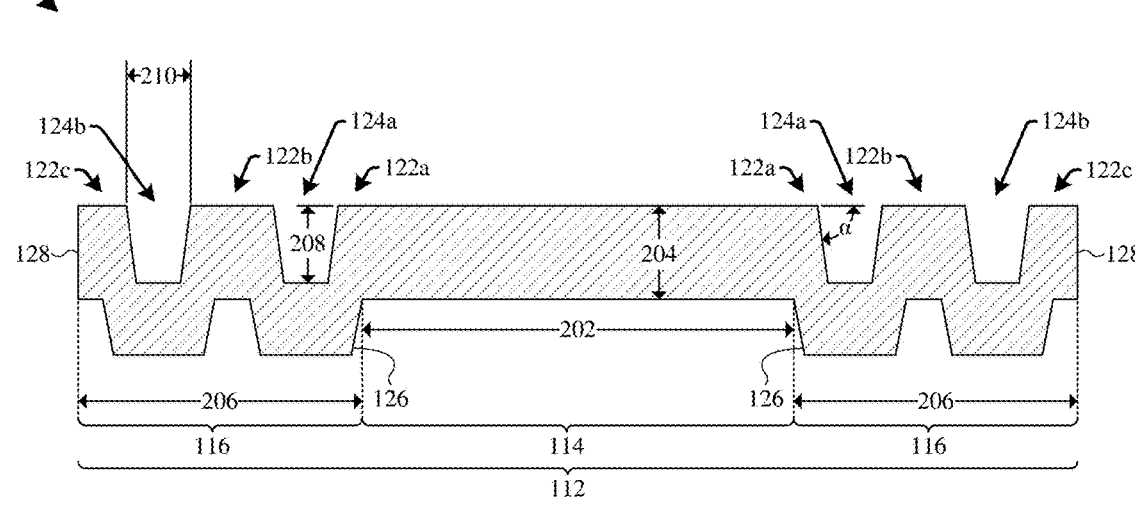
FIG. 2 illustrates a magnified cross-sectional view of some embodiments of the movable diaphragm of the semiconductor device of FIG. 1.

FIG. 2 illustrates a magnified cross-sectional view 200 of some embodiments of the movable diaphragm 112 of the semiconductor device 102 of FIG. 1.

As shown in the cross-sectional view 200 of FIG. 2, the flat portion 114 of the MEMS layer 108 has a first width 202. In some embodiments, the first width 202 is between about 5 millimeters (mm) and about 20 mm. The flat portion 114 of the MEMS layer 108 has a thickness 204. The thickness 204 of the flat portion 114 of the MEMS layer 108 may be between about 3 micrometers (um) and about 8 um. The corrugated portion 116 of the MEMS layer 116 has a second width 206. In some embodiments, the second width 206 is between about 1.5 um and about 5 um. In some embodiments, a ratio of the first width 202 to the second width 206 is between 20000:1.5 and 1000:1. In some embodiments, if the ratio of the first width 202 to the second width 206 is larger than 20000:1.5, the corrugated portion 116 of the MEMS layer 108 may not be able to adequately reduce and/or restrict (e.g., dampen) the oscillations of the flat portion 114 of the MEMS layer 108, such that the semiconductor device 100 has poor signal distortion (e.g., high audio distortion) in the high frequency range. In further embodiments, if the ratio of the first width 202 to the second width 206 is less than 1000:1, the output level (e.g., decibel (dB) level) of the semiconductor device 102 (e.g., MEMS speaker) may be less than a predetermined threshold level.

The one or more grooves 124 have a first depth 208. The first depth 208 of the one or more grooves 124 may be between about 0.3 um and about 1 um. In some embodiments, a ratio of the first depth 208 to the thickness 204 of the flat portion 114 of the MEMS layer 108 may be between about 8:0.3 and 3:1. In some embodiments, if the ratio of the first depth 208 to the thickness 204 of the flat portion 114 of the MEMS layer 108 is larger than 8:0.3, the corrugated portion 116 of the MEMS layer 108 may not be able to adequately dampen the oscillations of the flat portion 114 of the MEMS layer 108, such that the semiconductor device 102 has poor signal distortion in the high frequency range. In further embodiments, if the ratio of the first depth 208 to the thickness 204 of the flat portion 114 of the MEMS layer 108 is smaller than 3:1, the output level of the semiconductor device 102 may be less than the predetermined threshold level.

The one or more grooves 124 have a third width 210. In some embodiments, the third width 210 is between about 1.5 um and about 5 um. In some embodiments, if the third width 210 is less than about 1.5 um, the corrugated portion 116 of the MEMS layer 108 may not be able to adequately dampen the oscillations of the flat portion 114 of the MEMS layer 108, such that the semiconductor device 102 has poor signal distortion in the high frequency range. In further embodiments, if the third width 210 is greater than about 5 um, the output level of the semiconductor device 102 may be less than the predetermined threshold level.

The corrugated portion 116 of the MEMS layer 108 may comprise between 1 and about 10 of the grooves 124. The corrugated portion 116 of the MEMS layer 108 may comprise between 1 and about 11 of the ridges 122. In some embodiments, if the corrugated portion 116 of the MEMS layer 108 comprises less than one groove 124 and/or less than one ridge 122, the corrugated portion 116 of the MEMS layer 108 may not be able to adequately dampen the oscillations of the flat portion 114 of the MEMS layer 108. In further embodiments, if the corrugated portion 116 of the MEMS layer 108 comprises more than about ten grooves 124 and/or more than about eleven ridges 122, the output level of the semiconductor device 102 may be less than the predetermined threshold level.

In some embodiments, the sidewalls of the one or more grooves 124 are angled, as shown in the cross-sectional view 200 of FIG. 2. In other embodiments, the sidewalls of the one or more grooves 124 may be substantially vertical. More specifically, in some embodiments, the sidewalls of the grooves 124 may extend from upper surfaces of corresponding ridges 122 at an angle α that is between about 45 degrees and 90 degrees. In some embodiments, the first outer sidewalls 128 of the movable diaphragm 112 are substantially vertical, as shown in the cross-sectional view 200 of FIG. 2. In other emblements, the first outer sidewalls 128 of the movable diaphragm 112 may be angled.

In some embodiments, bottom surfaces of the one or more grooves 124 are substantially planar, as shown in the cross-sectional view 200 of FIG. 2. In other embodiments, the bottom surfaces of the one or more grooves 124 may be rounded. In further embodiments, the bottom surfaces of the one or more grooves 124 may be disposed vertically between the upper surface of the flat portion 114 of the MEMS layer 108 and the bottom surface of the flat portion 114 of the MEMS layer 108. In some embodiments, upper surfaces of the one or more ridges 122 are substantially planar, as shown in the cross-sectional view 200 of FIG. 2. In other embodiments, the upper surfaces of the one or more ridges 122 may be rounded.

Figure 3:
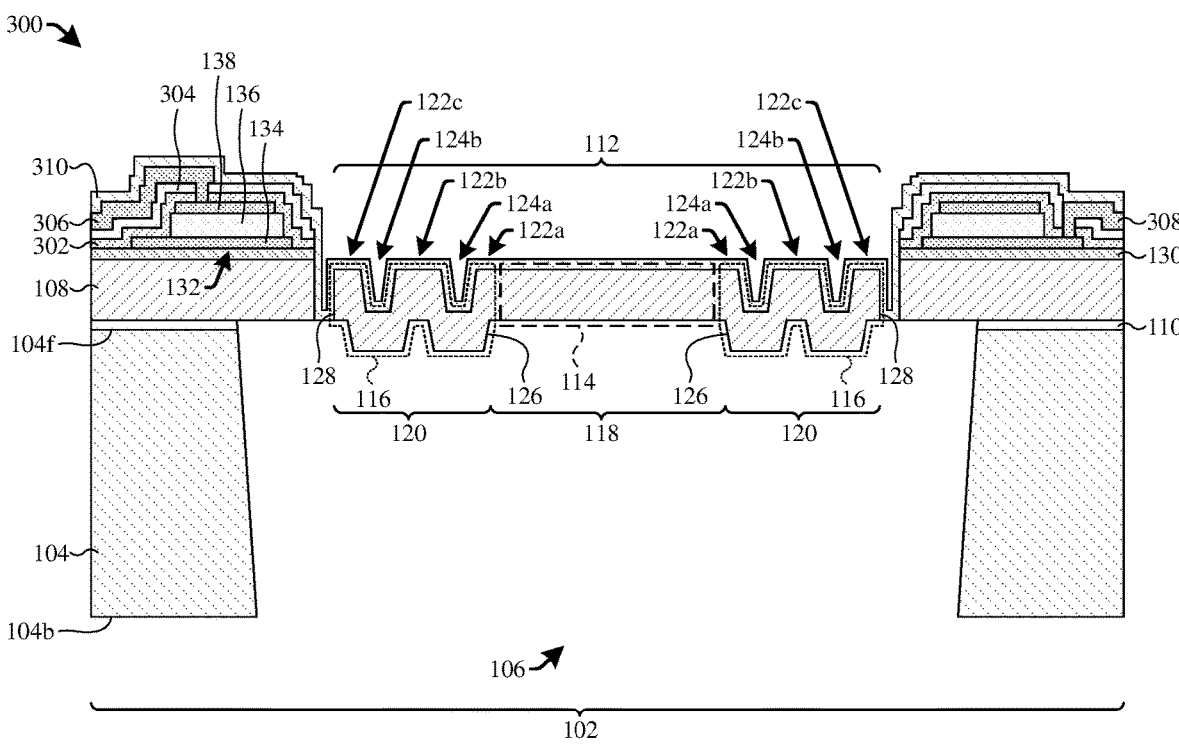
FIG. 3 illustrates a cross-sectional view of some other embodiments of the semiconductor device of FIG. 1.

FIG. 3 illustrates a cross-sectional view 300 of some other embodiments of the semiconductor device 102 of FIG. 1.

As shown in the cross-sectional view 300 of FIG. 3, the piezoelectric structure 136 is disposed vertically between the lower electrode 134 and the upper electrode 138. In some embodiments, opposite sidewalls of the piezoelectric structure 136 are disposed laterally between opposite sidewalls of the lower electrode 134. In further embodiments, opposite sidewalls of the upper electrode 138 are disposed laterally between the opposite sidewalls of the piezoelectric structure 136.

A first passivation layer 302 is disposed over the MEMS layer 108 and the one or more actuation devices 132. The first passivation layer 302 may be or comprise, for example, an oxide (e.g., $SiO_2$), a nitride (e.g., SiN), an oxy-nitride (e.g., $SiO_XN_Y$), titanium nitride (TiN), aluminum oxide ($Al_2O_3$), some other passivation material, or a combination of the foregoing. In some embodiments, the first passivation layer 302 lines the second dielectric layer 130, the lower electrode 134, the piezoelectric structure 136, and the upper electrode 138. In some embodiments, a sidewall of the first passivation layer 302 is disposed laterally between the lower electrode 134 and the movable diaphragm 112. In further embodiments, the sidewall of the first passivation layer 302 is substantially aligned with a sidewall of the second dielectric layer 130 and/or a sidewall of the MEMS layer 108.

A third dielectric layer 304 is disposed over the MEMS layer 108 and the one or more actuation devices 132. The third dielectric layer 304 may be or comprise, for example, an oxide (e.g., $SiO_2$), a nitride (e.g., SiN), an oxy-nitride (e.g., $SiO_XN_Y$), some other dielectric material, or a combination of the foregoing. In some embodiments, the third dielectric layer 304 is silicon dioxide ($SiO_2$). In further embodiments, the third dielectric layer 304, the first dielectric layer 110, and/or the second dielectric layer 130 comprise a same material (e.g., $SiO_2$).

In some embodiments, the third dielectric layer 304 is disposed over the first passivation layer 302. In further embodiments, the third dielectric layer 304 lines the first passivation layer 302. A sidewall of the third dielectric layer 304 may be disposed laterally between the lower electrode 134 and the movable diaphragm 112. In some embodiments, the sidewall of the third dielectric layer 304 is substantially aligned with the sidewall of the first passivation layer 302, the sidewall of the second dielectric layer 130, and/or the sidewall of the MEMS layer 108.

A first conductive structure 306 is disposed over the MEMS layer 108 and the second dielectric layer 130. In some embodiments, the first conductive structure 306 is disposed over the first passivation layer 302 and/or the third dielectric layer 304. In yet further embodiments, the first conductive structure 306 partially lines the third dielectric layer 304. The first conductive structure 306 may be or comprise, for example, aluminum copper (AlCu), copper (Cu), aluminum (Al), tungsten (W), gold (Au), silver (Ag), some other conductive material, or a combination of the foregoing.

The first conductive structure 306 is electrically coupled to the upper electrode 138. The first conductive structure 306 provides an electrical path from a first electronic device (not shown) (e.g., insulated gate field-effect transistor (IGFET)) to the upper electrode 138. The first electronic device is configured to provide a first bias voltage to the upper electrode 138. In some embodiments, the first electronic device is disposed over/in the MEMS layer 108 (e.g., laterally spaced from the one or more actuation devices 132 and the movable diaphragm 112). In other embodiments, the first electronic device is disposed on a separate integrated chip (IC) than the semiconductor device 102. In such embodiments, the separate IC may be bonded to the IC comprising the semiconductor device 102, such that the first electronic device is electrically coupled to the first conductive structure 306. In other such embodiments, the separate IC and the IC comprising the semiconductor device 102 may be electrically coupled via one or more input/output (I/O) structures (e.g., bond pads, solder bumps, etc.).

A second conductive structure 308 is disposed over the MEMS layer 108 and the second dielectric layer 130. In some embodiments, the second conductive structure 308 is disposed over the first passivation layer 302 and/or the third dielectric layer 304. In yet further embodiments, the second conductive structure 308 partially lines the third dielectric layer 304. The second conductive structure 308 may be or comprise, for example, aluminum copper (AlCu), copper (Cu), aluminum (Al), tungsten (W), gold (Au), silver (Ag), some other conductive material, or a combination of the foregoing. In some embodiments, the first conductive structure 306 and the second conductive structure 308 comprise a same material (e.g., AlCu).

The second conductive structure 308 is electrically coupled to the lower electrode 134. The second conductive structure 308 provides an electrical path from a second electronic device (not shown) (e.g., IGFET) to the lower electrode 134. The second electronic device is configured to provide a second bias voltage to the lower electrode 134. In some embodiments, the second electronic device is disposed over/in the MEMS layer 108 (e.g., laterally spaced from the one or more actuation devices 132 and the movable diaphragm 112). In other embodiments, the second electronic device is disposed on the separate IC. In such embodiments, the separate IC may be bonded to the IC comprising the semiconductor device 102, such that the second electronic device is electrically coupled to the second conductive structure 308 and the first electronic device is electrically coupled to the first conductive structure 306. Because the first electronic device is configured to provide the first bias voltage to the upper electrode 138 and the second electronic device is configured to provide the second bias voltage to the lower electrode 134, a voltage can be selectively applied across the piezoelectric structure 136. Accordingly, by applying a voltage across the piezoelectric structure 136, the piezoelectric structure 136 can be deflected, thereby selectively displacing (e.g., oscillating) the movable diaphragm 112 at different frequencies.

A second passivation layer 310 is disposed over the MEMS layer 108, the one or more actuation devices 132, the first conductive structure 306, the second conductive structure 308, and the movable diaphragm 112. The second passivation layer 310 may be or comprise, for example, a nitride (e.g., SiN), an oxide (e.g., $SiO_2$), an oxy-nitride (e.g., $SiO_XN_Y$), some other passivation material, or a combination of the foregoing. In some embodiments, the second passivation layer 310 is silicon nitride (SiN). In further embodiments, the second passivation layer 310 comprises a different material than the first passivation layer 302, the third dielectric layer 304, the second dielectric layer 130, and/or the first dielectric layer 110.

In some embodiments, the second passivation layer 310 lines the first conductive structure 306, the second conductive structure 308, the third dielectric layer 304, and the movable diaphragm 112. More specifically, the second passivation layer 310 lines the corrugated portion 116 of the MEMS layer 108 (e.g., the one or more grooves 124 and the one or more ridges 122) and the flat portion 114 of the MEMS layer 108. The second passivation layer 310 also bridges one or more gaps that are disposed between the movable diaphragm 112 and other portions of the MEMS layer 108 (e.g., portions of the MEMS layer 108 affixed to the substrate 104). In some embodiments, because the second passivation layer 310 bridges the one or more gaps that are disposed between the movable diaphragm 112 and the other portions of the MEMS layer 108, the second passivation layer 310 may, at least partially, support the movable diaphragm 112 so that the movable diaphragm 112 is suspended over (e.g., directly over) the cavity 106. In further embodiments, one or more tethers (not shown) (e.g., tethering portions of the MEMS layer 108) may, at least partially, support the movable diaphragm 112 so that the movable diaphragm 112 is suspended over (e.g., directly over) the cavity 106. In yet further embodiments, the second passivation layer 310 contacts (e.g., directly contacts) the first conductive structure 306, the second conductive structure 308, the third dielectric layer 304, the first passivation layer 302, the second dielectric layer 130, the other portions of the MEMS layer 108, and the movable diaphragm 112.

Figure 4:
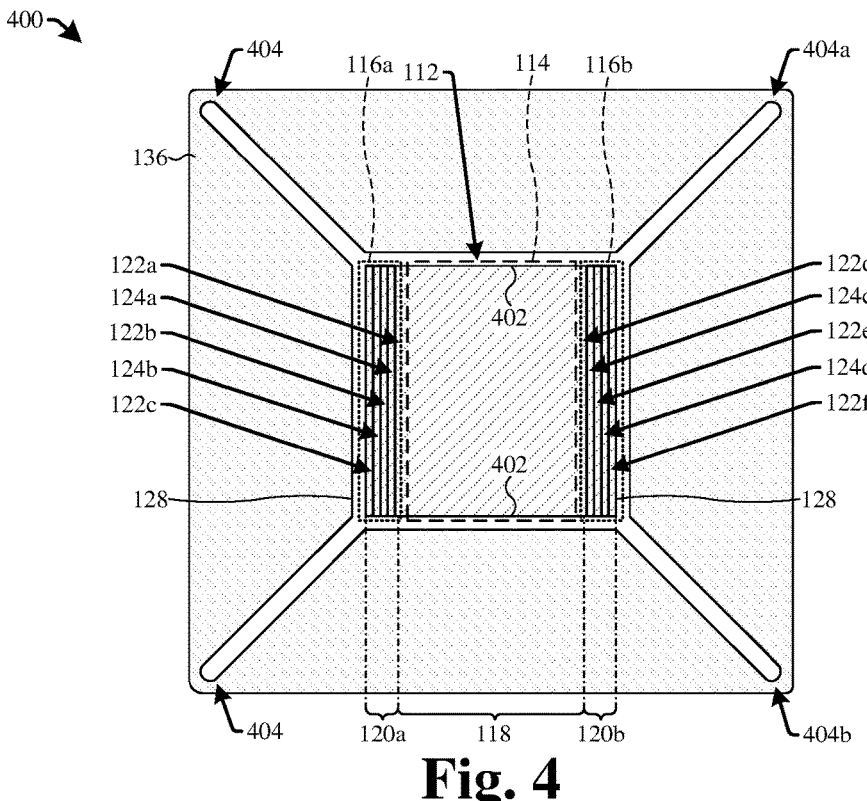
FIG. 4 illustrates a simplified layout view of some embodiments of the semiconductor device of FIG. 1.

FIG. 4 illustrates a simplified layout view 400 of some embodiments of the semiconductor device 102 of FIG. 1. The simplified layout view 400 of FIG. 4 is "simplified" because the simplified layout view 400 of FIG. 4 only illustrates the piezoelectric structure 136 and the movable diaphragm 112.

As shown in the simplified layout view 400 of FIG. 4, the peripheral region 120 of the movable diaphragm 112 has a first portion 120a of the peripheral region 120 and a second portion 120b of the peripheral region 120. The first portion 120a of the peripheral region 120 and the second portion 120b of the peripheral region 120 are disposed on opposite sides of the central region 118 of the movable diaphragm 112.

The first outer sidewalls 128 of the movable diaphragm 112 are opposite one another and spaced apart in a first direction. In some embodiments, the movable diaphragm 112 comprises second outer sidewalls 402. The second outer sidewalls 402 of the movable diaphragm 112 are opposite one another and spaced apart in a second direction that is substantially perpendicular to the first direction. In some embodiments, the first portion 120a of the peripheral region 120, the second portion 120b of the peripheral region 120, and the central region 118 of the movable diaphragm 112 extend continuously between the second outer sidewalls 402 of the movable diaphragm 112. In such embodiments, the central region 118 laterally separates the first portion 120a of the peripheral region 120 from the second portion 120b of the peripheral region 120. In further embodiments, the first portion 120a of the peripheral region 120 extends laterally (e.g., in the first direction) from the central region 118 of the movable diaphragm 112 to one of the first outer sidewalls 128 of the movable diaphragm 112. In yet further embodiments, the second portion 120b of the peripheral region 120 extends laterally from the central region 118 of the movable diaphragm 112 to another one of the first outer sidewalls 128 of the movable diaphragm 112.

In some embodiments, the corrugated portion 116 of the MEMS layer 108 comprises a first section 116a of the corrugated portion 116 and a second section 116b of the corrugated portion 116. The first section 116a of the corrugated portion 116 is disposed in the first portion 120a of the peripheral region 120. The second section 116b of the corrugated portion 116 is disposed in the second portion 120b of the peripheral region 120. In some embodiments, the flat portion 114 of the MEMS layer 108 defines the central region 118 of the movable diaphragm 112, as shown in the simplified layout view 400 of FIG. 4. In further embodiments, the corrugated portion 116 defines the peripheral region 120 of the movable diaphragm 112, as shown in the simplified layout view 400 of FIG. 4. More specifically, as shown in the simplified layout view 400 of FIG. 4, the first section 116a of the corrugated portion 116 may define the first portion 120a of the peripheral region 120, and the second section 116b of the corrugated portion 116 may define the second portion 120b of the peripheral region 120.

The first section 116a of the corrugated portion 116 comprises a first set of one or more ridges 122 and one or more grooves 124. For example, the first section 116a of the corrugated portion 116 comprises the first ridge 122a, the second ridge 122b, the third ridge 122c, the first groove 124a, and the second groove 124b. The one or more ridges 122 and the one or more grooves 124 of the first set alternate from the flat portion 114 of the MEMS layer 108 to one of the first outer sidewalls 128 of the movable diaphragm 112.

The second section 116b of the corrugated portion 116 comprises a second set of one or more ridges 122 and one or more grooves 124. For example, the second section 116b of the corrugated portion 116 comprises a fourth ridge 122d, a fifth ridge 122e, a sixth ridge 122f, a third groove 124c, and the fourth groove 124d. The one or more ridges 122 and the one or more grooves 124 of the second set alternate from the flat portion 114 of the MEMS layer 108 to another one of the first outer sidewalls 128 of the movable diaphragm 112.

In some embodiments, one or more slots 404 are disposed in the piezoelectric structure 136. The one or more slots 404 extend from one or more inner sidewalls of the piezoelectric structure 136 toward one or more outer sidewalls of the piezoelectric structure 136. For example, as shown in the simplified layout view 400 of FIG. 4, the one or more slots 404 comprises a first slot 404a and a second slot 404b. The first slot 404a and the second slot 404b extend from a first inner sidewall of the piezoelectric structure 136. The first slot 404a also extends from a second inner sidewall of the piezoelectric structure 136. The second slot 404b also extends from a third inner sidewall of the piezoelectric structure 136 that is opposite the second inner sidewall of the piezoelectric structure 136.

In some embodiments, the one or more slots 404 extend from corresponding inner sidewalls of the piezoelectric structure 136 at substantially similar angles. For example, as shown in the simplified layout view 400 of FIG. 4, the first slot 404a extends from the first inner sidewall of the piezoelectric structure 136 at a first angle and extends from the second inner sidewall of the piezoelectric structure 136 at a second angle. The second slot 404b also extends from the first inner sidewall of the piezoelectric structure 136 at the first angle and extends from the third inner sidewall of the piezoelectric structure 136 at the second angle. In some embodiments, the first angle and the second angle are substantially the same (e.g., 45 degrees). In other embodiments, the first angle and the second angle are different.

Figure 5:
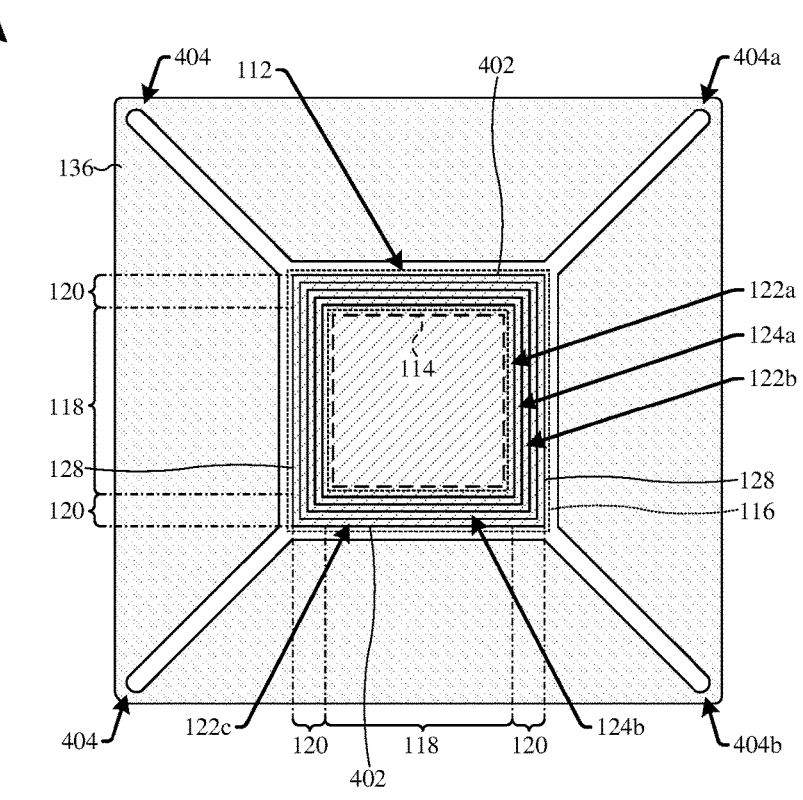
FIG. 5 illustrates a simplified layout view of some embodiments of the semiconductor device of FIG. 1.

FIG. 5 illustrates a simplified layout view 500 of some embodiments of the semiconductor device 102 of FIG. 1. The simplified layout view 500 of FIG. 5 is "simplified" because the simplified layout view 500 of FIG. 5 only illustrates the piezoelectric structure 136 and the movable diaphragm 112.

As shown in the simplified layout view 500 of FIG. 5, the peripheral region 120 of the movable diaphragm 112 extends laterally around the central region 118 of the movable diaphragm 112 in a closed loop path. In some embodiments, the peripheral region 120 of the movable diaphragm 112 also extends continuously from the central region 118 of the movable diaphragm 112 to both the first outer sidewalls 128 and the second outer sidewalls 402. The corrugated portion 116 of the MEMS layer 108 may extend laterally around the flat portion 114 of the MEMS layer 108 in a closed loop path. In some embodiments, the corrugated portion 116 of the MEMS layer 108 also extends continuously from the flat portion 114 of the MEMS layer 108 to both the first outer sidewalls 128 and the second outer sidewalls 402. In further embodiments, the corrugated portion 116 of the MEMS layer 108 defines the peripheral region 120 of the movable diaphragm 112, as shown in the simplified layout view 500 of FIG. 5.

In some embodiments, the one or more grooves 124 extend laterally around the central region 118 of the movable diaphragm 112 in closed loop paths, respectively. In such embodiments, the grooves 124 may be concentric. In further embodiments, the one or more ridges 122 extend laterally around the central region 118 of the movable diaphragm 112 in closed loop paths, respectively. In such embodiments, the ridges 122 may be concentric. Because the one or more grooves 124 and the one or more ridges 122 extend laterally around the central region 118 of the movable diaphragm 112 in closed loop paths, the semiconductor device 102 may have even better signal distortion (e.g., even lower audio distortion) in the high frequency range (e.g., due to the one or more grooves 124 and the one or more ridges 122 reducing stress along both a first axis and a second axis that is perpendicular to the first axis).

Figure 6:
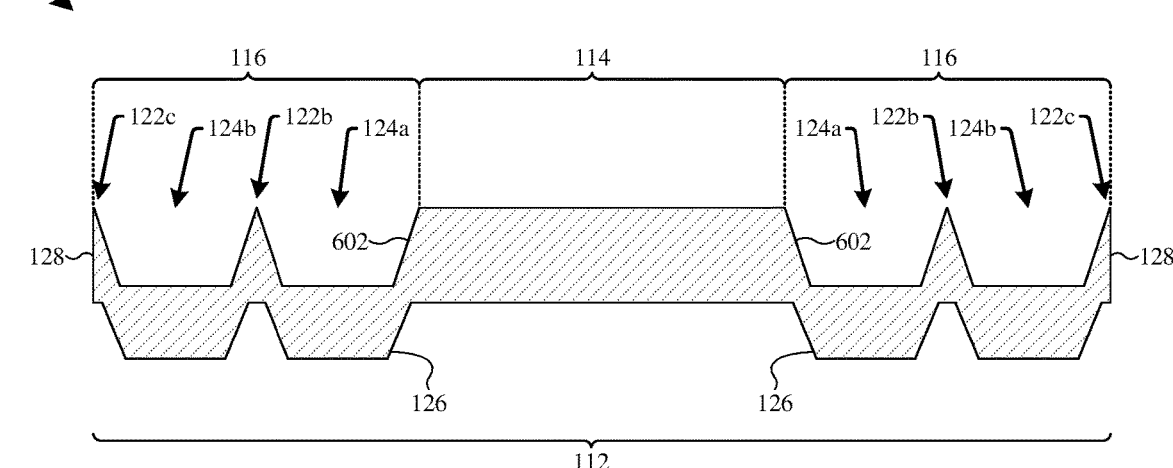
FIG. 6 illustrates a cross-sectional view of some other embodiments of the movable diaphragm of the semiconductor device of FIG. 1.

FIG. 6 illustrates a cross-sectional view 600 of some other embodiments of the movable diaphragm 112 of the semiconductor device 102 of FIG. 1.

As shown in the cross-sectional view 600 of FIG. 6, rather than an inner boundary of the corrugated portion 116 of the MEMS layer 108 being defined by a point in which a bottom surface 126 of the MEMS layer 108 extends at an angle from the bottom surface of the flat portion 114 of the MEMS layer 108 (see, e.g., FIG. 1), the inner boundary of the corrugated portion 116 of the MEMS layer 108 is defined by a point in which a sidewall of one of the grooves 124 extends at an angle from an upper surface of the flat portion 114 of the MEMS layer 108. In other words, the point in which the sidewall of the one of the grooves 124 extends at the angle from the upper surface of the flat portion 114 of the MEMS layer 108 defines the point in which the flat portion 114 of the MEMS layer 108 ends and the corrugated portion 116 of the MEMS layer 108 begins. For example, the first groove 124a is disposed nearer the flat portion 114 of the MEMS layer 108 than each of the other grooves 124 and each of the ridges 122. The first groove 124a comprises a sidewall 602. The point at which the sidewall 602 of the first groove 124a extends at an angle from the upper surface of the flat portion 114 of the MEMS layer 108 defines the point at which the flat portion 114 of the MEMS layer 108 ends and the corrugated portion 116 of the MEMS layer 108 begins.

In some embodiments, one or more of the ridges 122 may refer to pointed peaks at which two sidewalls of the movable diaphragm 112 meet, as shown in the cross-sectional view 600 of FIG. 6. For example, the corrugated portion 116 of the MEMS layer 108 comprises the first groove 124a, the second groove 124b, the second ridge 122b, and the third ridge 122c. The first groove 124a and the second groove 124b each have angled sidewalls that meet at a first pointed peak. In such embodiments, the second ridge 122b may refer to the first pointed peak. Further, an angled sidewall of the second groove 124b may meet the first outer sidewalls 128 of the movable diaphragm 112 at a second pointed peak. In such embodiments, the third ridge 122c may refer to the second pointed peak. It will be appreciated that, in some embodiments, some of the ridges 122 of the corrugated portion 116 of the MEMS layer 108 may refer to pointed peaks and some other of the ridges 122 of the corrugated portion 116 of the MEMS layer 108 may refer to substantially flat (or rounded) upper surfaces.

FIGS. 7-18 illustrate a series of cross-sectional views 700-1800 of some embodiments of a method for forming a semiconductor device 102 with improved signal distortion. Although FIGS. 7-18 are described with reference to a method, it will be appreciated that the structures shown in FIGS. 7-18 are not limited to the method but rather may stand alone separate of the method.

Figure 7:
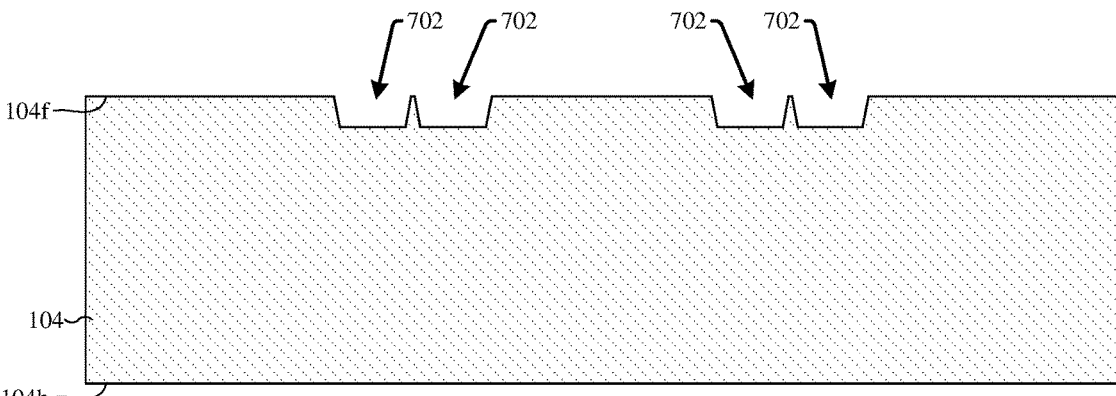
FIGS. 7-18 illustrates a series of cross-sectionals views of some embodiments of a method for forming a semiconductor device with improved signal distortion.

As shown in cross-sectional view 700 of FIG. 7, a plurality of corrugation trenches 702 are formed in the substrate 104. The corrugation trenches 702 extend into the substrate 104 from a front-side 102f of the substrate 104. The corrugation trenches 702 may have angled sidewalls, as shown in the cross-sectional view 700 of FIG. 7. In other embodiments, the sidewalls of the corrugation trenches 702 may be substantially vertical. In some embodiments, the corrugation trenches 702 may have substantially planar bottom surfaces, as illustrated in the cross-sectional view 700 of FIG. 7. In other embodiments, the bottom surfaces of the corrugation trenches 702 may be rounded. In some embodiments, the plurality of corrugation trenches 702 may comprise between 1 and 10 individual corrugation trenches.

In some embodiments, a process for forming the plurality of corrugation trenches 702 comprises forming a patterned masking layer (not shown) (e.g., positive/negative photoresist, a hardmask, etc.) on the front-side 104f of the substrate 104. The patterned masking layer may be formed by forming a masking layer (not shown) on the front-side 104f of the substrate 104 (e.g., via a spin-on process), exposing the masking layer to a pattern (e.g., via a lithography process, such as photolithography, extreme ultraviolet lithography, or the like), and developing the masking layer to form the patterned masking layer. Thereafter, with the patterned masking layer in place, an etching process is performed on the substrate 104 to selectively etch the substrate 104 according to the patterned masking layer. The etching process removes unmasked portions of the substrate 104, thereby forming the plurality of corrugation trenches 702. In some embodiments, the etching process may be, for example, a wet etching process, a dry etching process, a reactive ion etching (RIE) process, some other etching process, or a combination of the foregoing.

Figure 8:
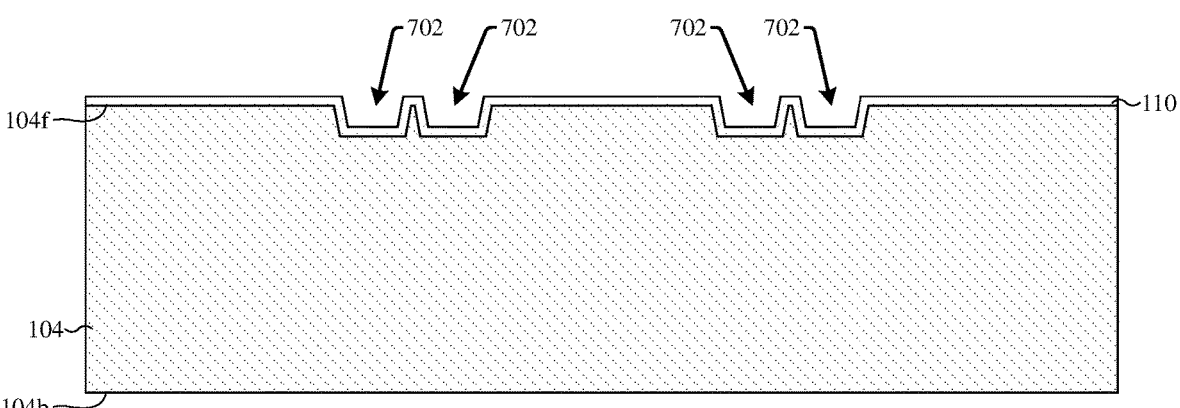

As shown in cross-sectional view 800 of FIG. 8, a first dielectric layer 110 is formed over the front-side 104f of the substrate 104 and in the plurality of corrugation trenches 702. In some embodiments, the first dielectric layer 110 is formed on the front-side 104f of the substrate 104 and lining the plurality of corrugation trenches 702. In some embodiments, a process for forming the first dielectric layer 110 comprises depositing or growing a first dielectric material on the substrate 104, thereby forming the first dielectric layer 110. The first dielectric material may be or comprise, for example, an oxide (e.g., $SiO_2$), a nitride (e.g., SiN), an oxy-nitride (e.g., $SiO_xN_y$), some other dielectric material, or a combination of the foregoing. In some embodiments, the first dielectric material is silicon dioxide ($SiO_2$). The first dielectric material may be deposited or grown by, for example, chemical vapor deposition (CVD), physical vapor deposition (PVD), atomic layer deposition (ALD), thermal oxidation, some other deposition or growth process, or a combination of the foregoing.

Figure 9:
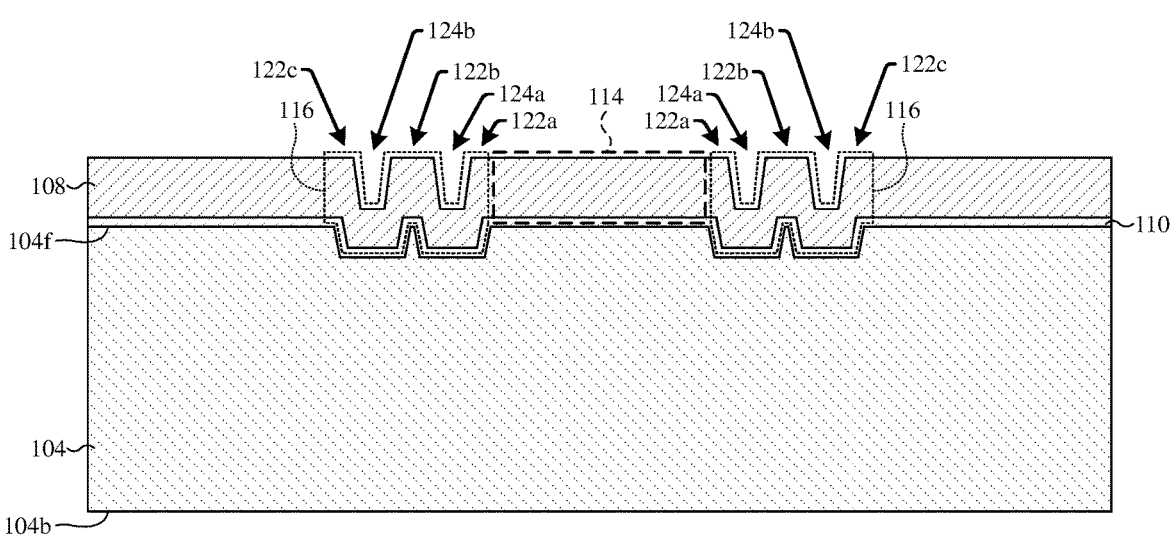

As shown in cross-sectional view 900 of FIG. 9, a MEMS layer 108 is formed over the first dielectric layer 110 and the substrate 104. The MEMS layer 108 is formed filling the plurality of corrugation trenches 702. The MEMS layer 108 comprises a flat portion 114 and a corrugated portion 116. The flat portion 114 of the MEMS layer 108 has an upper surface and a bottom surface. The upper and bottom surfaces of the flat portion 114 of the MEMS layer 108 both extend continuously between opposite sides of the corrugated portion 116 of the MEMS layer 108. In some embodiments, the bottom surface and the upper surface of the flat portion 114 of the MEMS layer 108 are substantially planar.

In some embodiments, the corrugated portion 116 of the MEMS layer 108 laterally surrounds the flat portion 114 of the MEMS layer 108. In such embodiments, the corrugated portion 116 of the MEMS layer 108 may extend laterally around the flat portion 114 of the MEMS layer 108 in a closed loop path. In other embodiments, the corrugated portion 116 of the MEMS layer 108 comprises a first section and a second section that are disposed on opposite sides of the flat portion 114 of the MEMS layer 108.

The corrugated portion 116 of the MEMS layer 108 comprises one or more ridges 122 and one or more grooves 124. For example, the corrugated portion 116 of the MEMS layer 108 may comprise a first ridge 122a, a second ridge 122b, a third ridge 122c, a first groove 124a, and a second groove 124b. The one or more ridges 122 and the one or more grooves 124 alternate throughout the corrugated portion 116 of the MEMS layer 108 in a predefined pattern (e.g., back and forth).

In some embodiments, an inner boundary of the corrugated portion 116 of the MEMS layer 108 is defined by a point in which a bottom surface 126 of the MEMS layer 108 extends at an angle from the bottom surface of the flat portion 114 of the MEMS layer 108. In other words, the point in which the bottom surface 126 of the MEMS layer 108 extends at the angle from the bottom surface of the flat portion 114 of the MEMS layer 108 defines the point in which the flat portion 114 of the MEMS layer 108 ends and the corrugated portion 116 of the MEMS layer 108 begins. In some embodiments, the bottom surface 126 of the MEMS layer 108 is angled, as shown in the cross-sectional view 900 of FIG. 9. In other embodiments, the bottom surface 126 of the MEMS layer 108 is substantially vertical.

In some embodiments, a process for forming the MEMS layer 108 comprises depositing the MEMS layer 108 on the first dielectric layer 110 and in the plurality of corrugation trenches 702. The MEMS layer 108 may be deposited by, for example, CVD, PVD, ALD, sputtering, some other deposition process, or a combination of the foregoing. For example, in some embodiments, the MEMS layer 108 is polysilicon. In such embodiments, the polysilicon is deposited on (e.g., via CVD) the first dielectric layer 110 and filling the plurality of corrugation trenches 702, thereby forming the MEMS layer 108.

In some embodiments, the MEMS layer 108 is deposited as a conformal layer, as shown in the cross-sectional view 900 of FIG. 9. In such embodiments, due to the plurality of corrugation trenches 702, the one or more ridges 122 and the one or more grooves 124 are formed during the deposition of the MEMS layer 108. As such, the dimensions (e.g., depth, width, angle of sidewalls, etc.) of the corrugation trenches 702 are such that the one or more ridges 122 and the one or more grooves 124 may be formed with predefined dimensions (see, e.g., FIG. 2).

It will be appreciated that the one or more ridges 122 and the one or more grooves 124 may be formed by other techniques. For example, the MEMS layer 108 may be formed with a planar upper surface and without the one or more ridges 122 or the one or more grooves 124 initially formed in in the MEMS layer 108. A patterned masking layer may then be formed on the MEMS layer 108. Thereafter, with the patterned masking layer in place, an etching process is performed on the MEMS layer 108 to selectively etch the MEMS layer 108 according to the patterned masking layer. The etching process removes unmasked portions of the MEMS layer 108, thereby forming the one or more ridges 122 and the one or more grooves 124. In some embodiments, the etching process may be, for example, a wet etching process, a dry etching process, a RIE process, some other etching process, or a combination of the foregoing.

Figure 10:
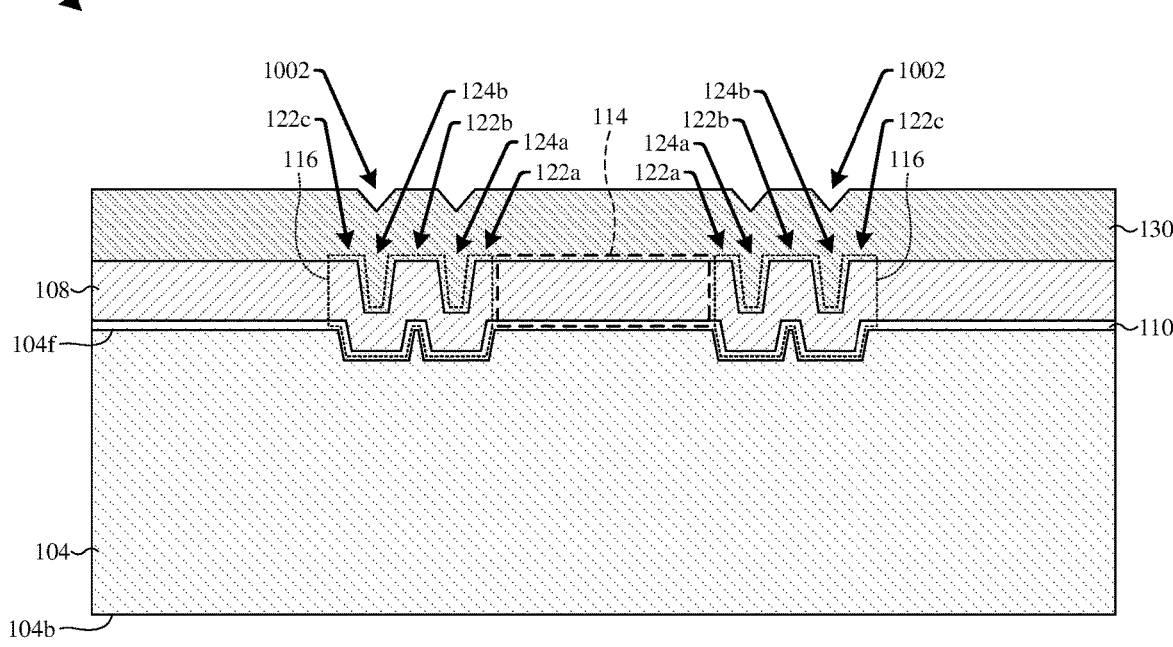

As shown in cross-sectional view 1000 of FIG. 10, a second dielectric layer 130 is formed over the MEMS layer 108 and in the one or more grooves 124. In some embodiments, the second dielectric layer 130 is formed with one or more divots 1002 that are disposed over (e.g., directly over) the one or more grooves 124, respectively. In some embodiments, a process for forming the second dielectric layer 130 comprises depositing or growing a second dielectric material on the MEMS layer 108 and in the one or more grooves 124, thereby forming the second dielectric layer 130. The second dielectric material may be or comprise, for example, an oxide (e.g., $SiO_2$), a nitride (e.g., SiN), an oxy-nitride (e.g., $SiO_xN_y$), some other dielectric material, or a combination of the foregoing. In some embodiments, the second dielectric material is silicon dioxide ($SiO_2$). The second dielectric material may be deposited or grown by, for example, CVD, PVD, ALD, thermal oxidation, some other deposition or growth process, or a combination of the foregoing.

Figure 11:
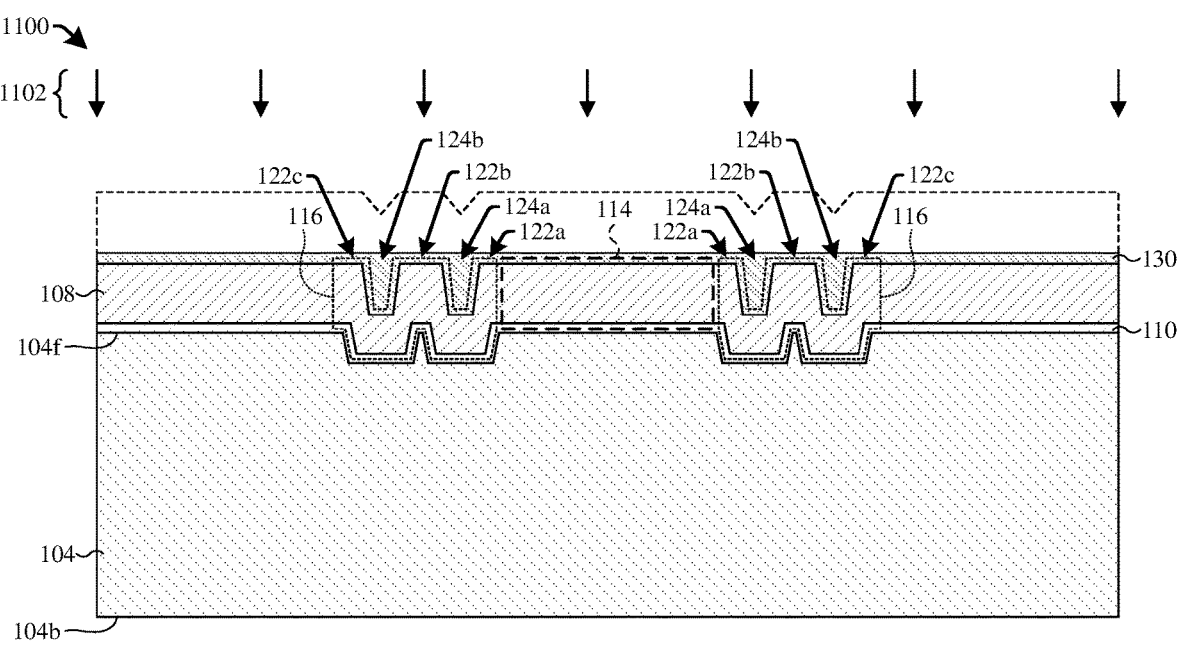

As shown in cross-sectional view 1100 of FIG. 11, a planarization process 1102 is performed on the second dielectric layer 130. The planarization process 1102 removes an upper portion of the second dielectric layer 130 (illustrated by a dotted line in the cross-sectional view 1100 of FIG. 11) and planarizes an upper surface of the second dielectric layer 130. In some embodiments, the planarization process 1102 may be, for example, a chemical-mechanical polishing (CMP) process.

Figure 12:
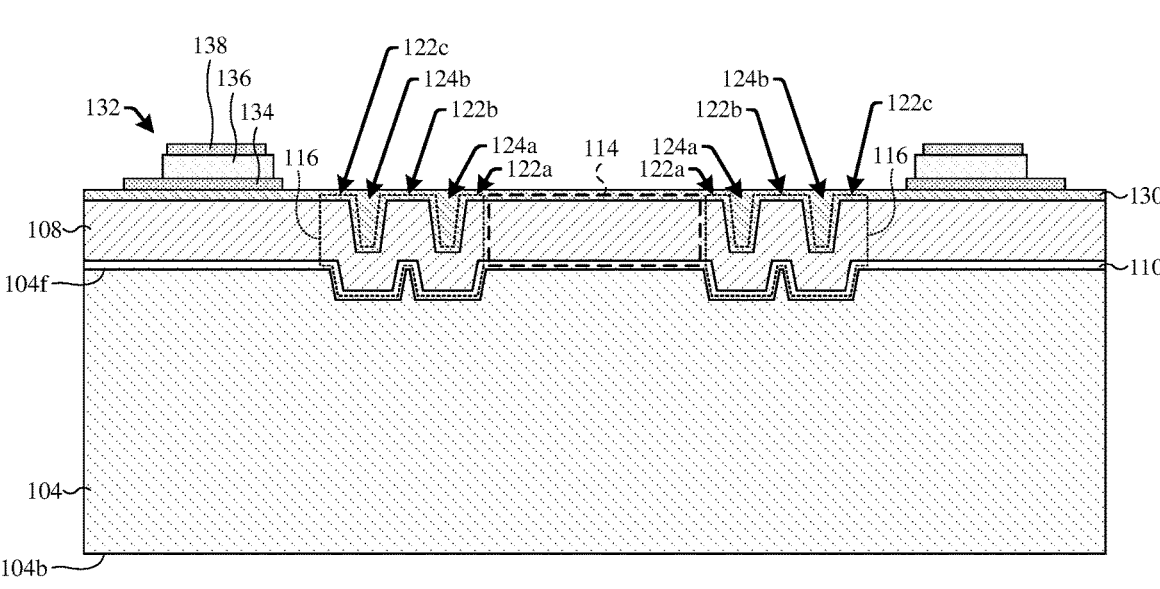

As shown in cross-sectional view 1200 of FIG. 12, one or more actuation devices 132 are formed over the second dielectric layer 130 and the MEMS layer 108. In some embodiments, the actuation device 132 is a piezoelectric actuation device, as shown in the cross-sectional view 1200 of FIG. 12. In such embodiments, the actuation device 132 comprises a lower electrode 134, a piezoelectric structure 136 overlying the lower electrode 134, and an upper electrode 138 overlying the piezoelectric structure 136.

In some embodiments, a process for forming the actuation device 132 comprises forming the lower electrode 134 over the second dielectric layer 130. In some embodiments, a process for forming the lower electrode 134 comprises depositing a first conductive layer (not shown) over the second dielectric layer 130. The first conductive layer may be or comprise, for example, platinum (Pt), titanium (Ti), copper (Cu), gold (Au), aluminum (Al), zinc (Zn), tin (Sn), some other conductive material, or a combination of the foregoing. The first conductive layer may be deposited by, for example, CVD, PVD, ALD, sputtering, electrochemical plating, electroless plating, some other deposition process, or a combination of the foregoing. A first patterned masking layer (not shown) (e.g., positive/negative photoresist, a hardmask, etc.) is then formed on the first conductive layer. Thereafter, with the first patterned masking layer in place, a first etching process is performed on the first conductive layer to remove unmasked portions of the first conductive layer, thereby forming the lower electrode 134. In some embodiments, the first etching process may be, for example, a wet etching process, a dry etching process, a RIE process, some other etching process, or a combination of the foregoing. In further embodiments, the first patterned masking layer may be stripped away.

The piezoelectric structure 136 is then formed over the lower electrode 134 and the second dielectric layer 130. In some embodiments, a process for forming the piezoelectric structure 136 comprises depositing a piezoelectric layer (not shown) over the lower electrode 134 and the second dielectric layer 130. The piezoelectric layer may be or comprise, for example, lead zirconate titanate (PZT), zinc oxide (ZnO), barium titanate ($BaTiO_3$), potassium niobate ($KNbO_3$), sodium-tungsten-oxide ($Na_2WO_3$), barium-sodium-niobium-oxide ($Ba_2NaNb_5O_5$), lead-potassium-niobium-oxide ($Pb_2KNb_5O_{15}$), langasite ($La_3Ga_5SiO_{14}$), gallium phosphate (GaPO$_4$), lithium-niobium-oxide (LiNbO$_3$), lithium tantalate (LiTaO$_3$), some other piezoelectric material, or a combination of the foregoing. The piezoelectric layer may be deposited by, for example, CVD, PVD, ALD, sputtering, a sol-gel process, some other deposition process, or a combination of the foregoing. A second patterned masking layer (not shown) (e.g., positive/negative photoresist, a hardmask, etc.) is then formed on the piezoelectric layer. Thereafter, with the second patterned masking layer in place, a second etching process is performed on the piezoelectric layer to remove unmasked portions of the piezoelectric layer, thereby forming the piezoelectric structure 136. In some embodiments, the second etching process may be, for example, a wet etching process, a dry etching process, a RIE process, some other etching process, or a combination of the foregoing. In further embodiments, the second patterned masking layer may be stripped away.

Thereafter, the upper electrode 138 is formed over the piezoelectric structure 136, the lower electrode 134, and the second dielectric layer 130. In some embodiments, a process for forming the upper electrode 138 comprises depositing a second conductive layer (not shown) over the piezoelectric structure 136, the lower electrode 134, and the second dielectric layer 130. The second conductive layer may be or comprise, for example, platinum (Pt), titanium (Ti), copper (Cu), gold (Au), aluminum (Al), zinc (Zn), tin (Sn), some other conductive material, or a combination of the foregoing. In some embodiments, the first conductive layer and the second conductive layer are a same material (e.g., Pt). The second conductive layer may be deposited by, for example, CVD, PVD, ALD, sputtering, electrochemical plating, electroless plating, some other deposition process, or a combination of the foregoing. A third patterned masking layer (not shown) (e.g., positive/negative photoresist, a hardmask, etc.) is then formed on the second conductive layer. Thereafter, with the third patterned masking layer in place, a third etching process is performed on the second conductive layer to remove unmasked portions of the second conductive layer, thereby forming the upper electrode 138. In some embodiments, the third etching process may be, for example, a wet etching process, a dry etching process, a RIE process, some other etching process, or a combination of the foregoing. In further embodiments, the third patterned masking layer may be stripped away.

Figure 13:
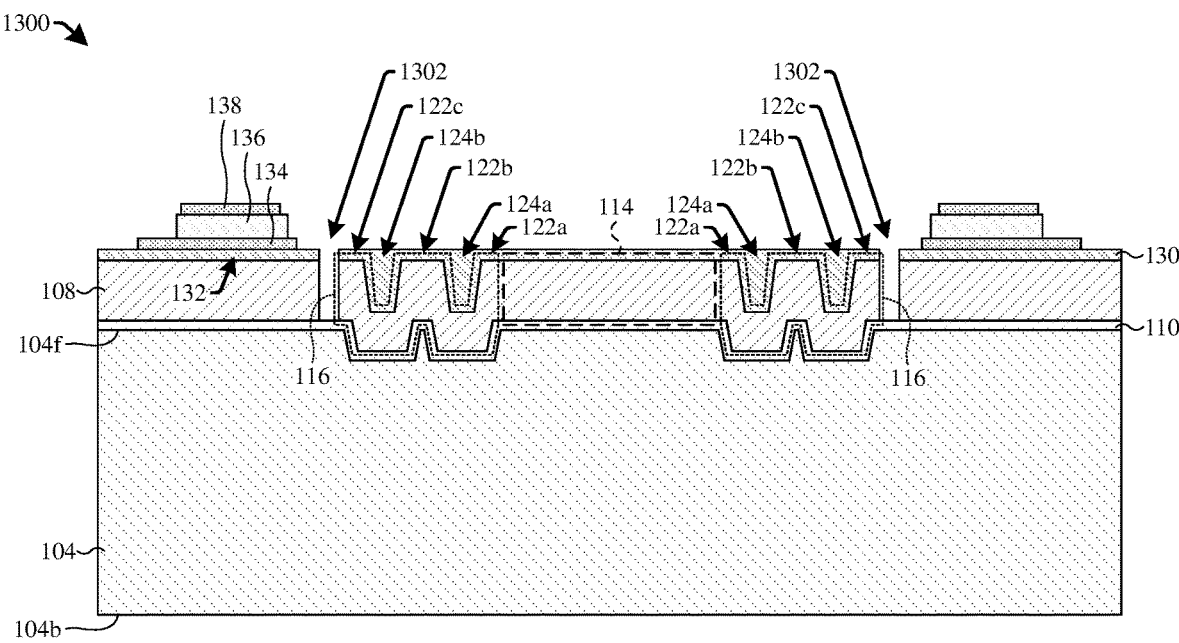

As shown in cross-sectional view 1300 of FIG. 13, diaphragm openings 1302 are formed in the MEMS layer 108. The diaphragm openings 1302 extend through (e.g., completely through) the MEMS layer 108 and expose portions of the first dielectric layer 110. In some embodiments, the diaphragm openings 1302 are discrete from one another (e.g., spaced from one another by portions of the MEMS layer 108. In other embodiments, the diaphragm openings 1302 refer to portions of a larger diaphragm opening that continuously extends through the MEMS layer 108 in a closed loop path.

The diaphragm openings 1302 are formed such that the corrugated portion 116 of the MEMS layer 108 and the flat portion 114 of the MEMS layer 108 are disposed between the diaphragm openings 1302. For example, in embodiments in which the diaphragm openings 1302 are discrete from one another, the diaphragm openings 1302 are formed such that the corrugated portion 116 of the MEMS layer 108 and the flat portion 114 of the MEMS layer 108 are disposed between opposite ones of the diaphragm openings 1302, or in embodiments in which diaphragm openings 1302 refer to portions of the larger diaphragm opening that continuously extends through the MEMS layer 108 in the closed loop path, the diaphragm openings 1302 are formed such that the corrugated portion 116 of the MEMS layer 108 and the flat portion 114 of the MEMS layer 108 are disposed within an inner perimeter of the larger diaphragm opening.

In some embodiments, a process for forming the diaphragm openings 1302 comprises forming a patterned masking layer (not shown) (e.g., positive/negative photoresist, a hardmask, etc.) over the second dielectric layer 130, the MEMS layer 108, the lower electrode 134, the piezoelectric structure 136, and the upper electrode 138. Thereafter, with the patterned masking layer in place, an etching process is performed on the second dielectric layer 130 and the MEMS layer 108 according to the patterned masking layer. The etching process removes unmasked portions of the second dielectric layer 130 and the MEMS layer 108, thereby forming the diaphragm openings 1302. In some embodiments, the etching process stops at the first dielectric layer 110 (e.g., the first dielectric layer 110 acts as an etch stop layer). In further embodiments, the etching process may be, for example, a wet etching process, a dry etching process, a RIE process, some other etching process, or a combination of the foregoing.

Figure 14:
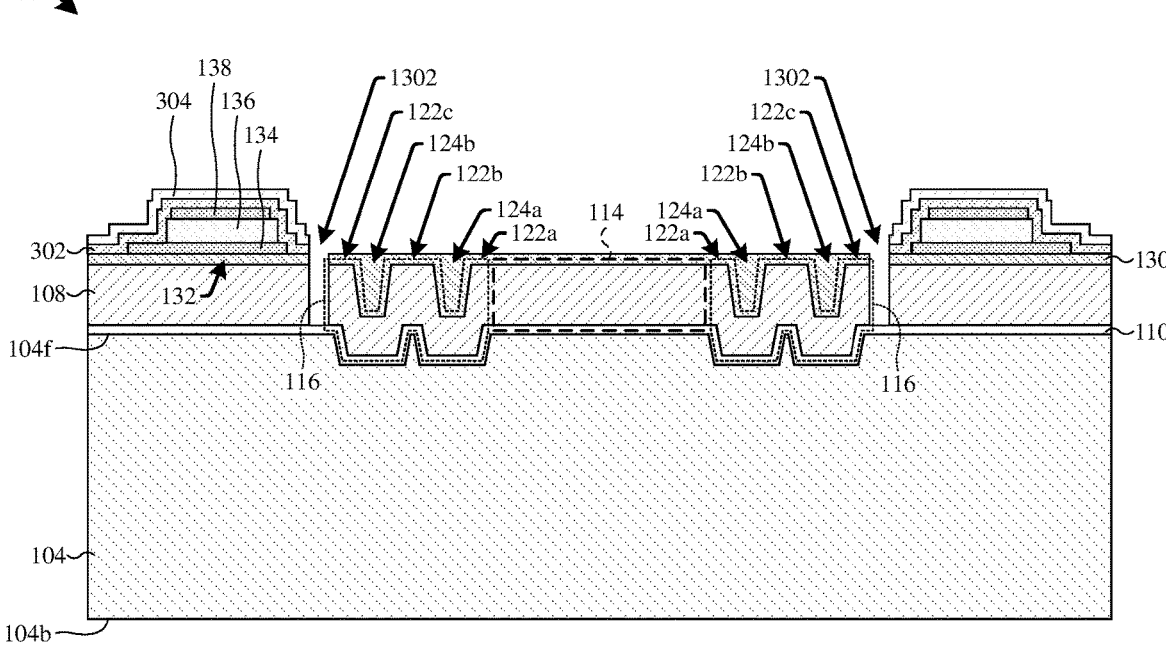

As shown in cross-sectional view 1400 of FIG. 14, a first passivation layer 302 is formed over the second dielectric layer 130, the lower electrode 134, the piezoelectric structure 136, and the upper electrode 138. In some embodiments, the first passivation layer 302 is formed lining the second dielectric layer 130, the lower electrode 134, the piezoelectric structure 136, and the upper electrode 138. In further embodiments, the first passivation layer 302 is formed with a sidewall that is substantially aligned with a sidewall of the second dielectric layer 130 and/or a sidewall of the MEMS layer 108.

Also shown in the cross-sectional view 1400 of FIG. 14, a third dielectric layer 304 is formed over the first passivation layer 302. In some embodiments, the third dielectric layer 304 is formed lining the first passivation layer 302. In further embodiments, the third dielectric layer 304 is formed with a sidewall that is substantially aligned with the sidewall of the first passivation layer 302, the sidewall of the second dielectric layer 130, and/or the sidewall of the MEMS layer 108.

In some embodiments, a process for forming the first passivation layer 302 and the third dielectric layer 304 comprises depositing the first passivation layer 302 on the second dielectric layer 130, the lower electrode 134, the piezoelectric structure 136, and the upper electrode 138. In some embodiments, the first passivation layer 302 is also deposited on the first dielectric layer 110 and/or in the diaphragm openings 1302. The first passivation layer 302 may be deposited by, for example, CVD, PVD, ALD, sputtering, some other deposition process, or a combination of the foregoing. The third dielectric layer 304 is then deposited on the first passivation layer 302. In some embodiments, the third dielectric layer 304 is also deposited in the diaphragm openings 1302. The third dielectric layer 304 may be deposited by, for example, CVD, PVD, ALD, some other deposition process, or a combination of the foregoing.

A patterned masking layer (not shown) (e.g., positive/negative photoresist, a hardmask, etc.) is then formed over the third dielectric layer 304 and the first passivation layer 302. Thereafter, with the patterned masking layer in place, an etching process is performed on the third dielectric layer 304 and the first passivation layer 302 to remove unmasked portions of the third dielectric layer 304 and the first passivation layer 302. In some embodiments, the etching process may be, for example, a wet etching process, a dry etching process, a RIE process, some other etching process, or a combination of the foregoing.

Figure 15:
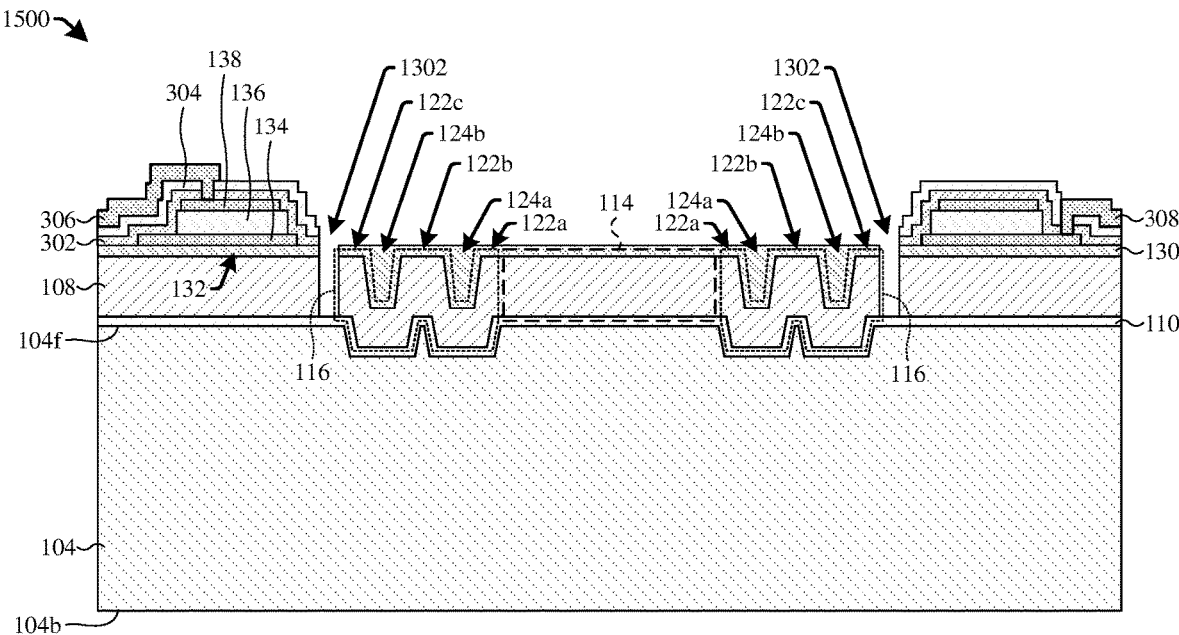

As shown in cross-sectional view 1500 of FIG. 15, a first conductive structure 306 and a second conductive structure 308 are formed over the MEMS layer 108 and the second dielectric layer 130. The first conductive structure 306 is electrically coupled to the upper electrode 138. The second conductive structure 308 is electrically coupled to the lower electrode 134. In some embodiments, the first conductive structure 306 is formed over the first passivation layer 302, the third dielectric layer 304, the lower electrode 134, the piezoelectric structure 136, and the upper electrode 138. In further embodiments, the first conductive structure 306 is formed extending vertically from the upper electrode 138 and partially lining the third dielectric layer 304. In some embodiments, the second conductive structure 308 is formed over the first passivation layer 302, the third dielectric layer 304, and the lower electrode 134. In further embodiments, the second conductive structure 308 is formed extending vertically from the lower electrode 134 and partially lining the third dielectric layer 304.

In some embodiments, a process for forming the first conductive structure 306 and the second conductive structure 308 comprises forming a first patterned masking layer (not shown) (e.g., positive/negative photoresist, a hardmask, etc.) over the third dielectric layer 304 and the second dielectric layer 130. With the first patterned masking layer in place, a first etching process is then performed on the third dielectric layer 304 and the first passivation layer 302. The first etching process removes unmasked portions of the third dielectric layer 304 and the first passivation layer 302, thereby forming via openings that extend vertically through (e.g., completely through) the third dielectric layer 304 and the first passivation layer 302. One of the via openings exposes the upper electrode 138 and another one of the via openings exposes the lower electrode 134. In some embodiments, the first etching process may be, for example, a wet etching process, a dry etching process, a RIE process, some other etching process, or a combination of the foregoing. In further embodiments, the first patterned masking layer is stripped away.

A conductive layer is then deposited over the third dielectric layer 304 and the second dielectric layer 130. The conductive layer is also deposited into (e.g., filling) the via openings. The conductive layer may be or comprise, for example, aluminum copper (AlCu), copper (Cu), aluminum (Al), tungsten (W), gold (Au), silver (Ag), some other conductive material, or a combination of the foregoing. The conductive layer may be deposited by, for example, CVD, PVD, ALD, sputtering, electrochemical plating, electroless plating, some other deposition process, or a combination of the foregoing.

Thereafter, a second patterned masking layer (not shown) (e.g., positive/negative photoresist, a hardmask, etc.) is formed over the third dielectric layer 304, the second dielectric layer 130, and the conductive layer. With the second patterned masking layer in place, a second etching process is then performed on the conductive layer. The second etching process removes unmasked portions of the conductive layer, thereby forming the first conductive structure 306 and the second conductive structure 308. In some embodiments, the second etching process may be, for example, a wet etching process, a dry etching process, a RIE process, some other etching process, or a combination of the foregoing. In other embodiments, the first conductive structure 306 and the second conductive structure 308 may be formed by one or more other processes (e.g., a damascene process).

As shown in cross-sectional view 1600 of FIG. 6, a portion of the second dielectric layer 130 that is disposed between the diaphragm openings 1302 is removed. In some embodiments, a process for removing the portion of the second dielectric layer 130 disposed between the diaphragm openings 1302 comprises forming a patterned masking layer (not shown) (e.g., positive/negative photoresist, a hardmask, etc.) over the third dielectric layer 304, the second dielectric layer 130, the first conductive structure 306 and the second conductive structure 308. The patterned masking layer exposes (e.g., does not mask) the portion of the second dielectric layer 130 disposed between the diaphragm openings 1302. With the patterned masking layer in place, an etching process is then performed on the second dielectric layer 130. The etching process removes unmasked portions of the second dielectric layer 130, thereby removing the portion of the second dielectric layer 130 disposed between the diaphragm openings 1302. In some embodiments, the etching process may be, for example, a wet etching process, a dry etching process, a RIE process, some other etching process, or a combination of the foregoing.

Figure 16:
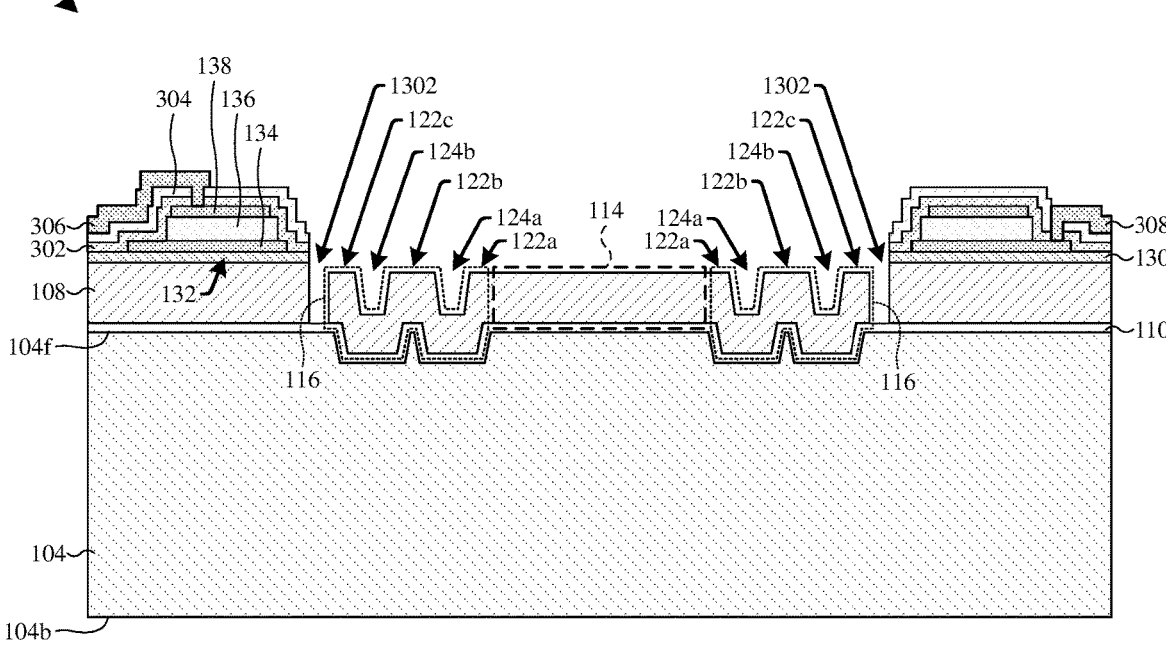

In some embodiments, the etching process may reduce a thickness of a portion of the MEMS layer 108 that is disposed between the diaphragm openings 1302, as shown in the cross-sectional view 1600 of FIG. 16. In other embodiments, the etching process may stop on the MEMS layer 108 (e.g., the MEMS layer 108 acts as an etch stop layer). The etching process may reduce the thickness of the portion of the MEMS layer disposed between the diaphragm openings 1302 to between about 3 um and about 8 um. It will be appreciated that, in other embodiments, the portion of the second dielectric layer 130 disposed between the diaphragm openings 1302 may be removed prior to forming the first conductive structure 306 and/or the second conductive structure 308 (e.g., the second dielectric layer 130 may be removed by the etching process utilized to form the third dielectric layer 304).

Figure 17:
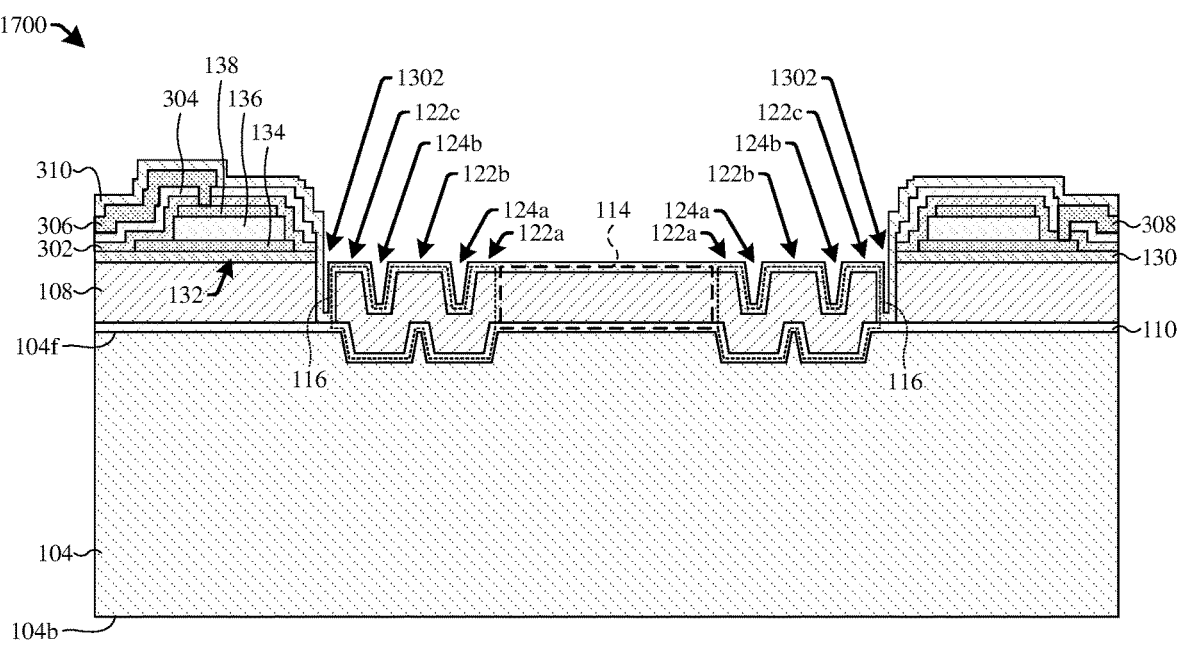

As shown in cross-sectional view 1700 of FIG. 17, a second passivation layer 310 is formed over the MEMS layer 108, the first conductive structure 306, the second conductive structure 308, the third dielectric layer 304, and the first dielectric layer 110. The second passivation layer 310 is also formed in the diaphragm openings 1302. In some embodiments, the second passivation layer 310 is formed lining the first conductive structure 306, the second conductive structure 308, the third dielectric layer 304, the diaphragm openings 1302, and the portion of the MEMS layer 108 disposed between the diaphragm openings 1302. More specifically, the second passivation layer 310 is formed lining the corrugated portion 116 of the MEMS layer 108 (e.g., the one or more grooves 124 and the one or more ridges 122) and the flat portion 114 of the MEMS layer 108. The second passivation layer 310 is formed extending horizontally across bottom surfaces of the diaphragm openings 1302.

In some embodiments, a process for forming the second passivation layer 310 comprises depositing the second passivation layer 310 on the first conductive structure 306, on the second conductive structure 308, on the third dielectric layer 304, on the portion of the MEMS layer 108 disposed between the diaphragm openings 1302, and lining the diaphragm openings 1302. The second passivation layer 310 may be formed by, for example, CVD, PVD, ALD, some other deposition process, or a combination of the foregoing.

In some embodiments, the second passivation layer 310 is deposited as a conformal layer.

Figure 18:
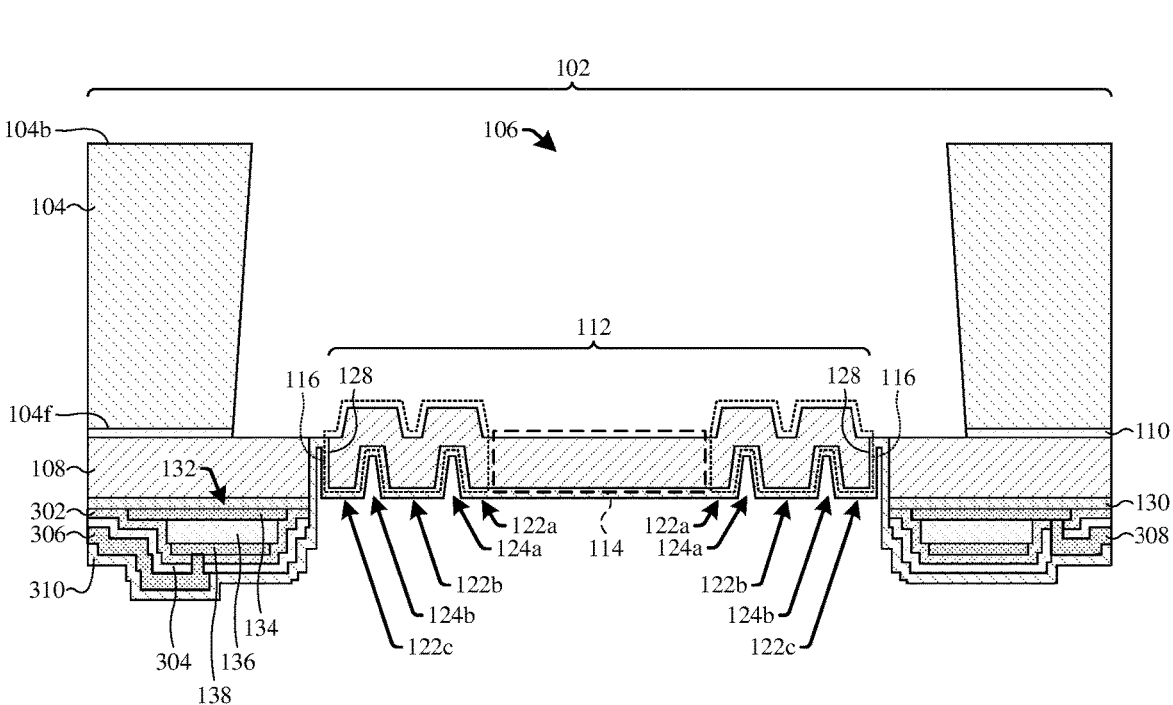

As shown in cross-sectional view 1800 of FIG. 18, a cavity 106 is formed in the substrate 104. The cavity 106 extends into the substrate 104 from a back-side 104b of the substrate 104 that is opposite the front-side 104f of the substrate 104. The cavity 106 is formed such that the diaphragm openings 1302 (see, e.g., FIG. 17) are disposed between sidewalls of the cavity 106. In some embodiments, the cavity 106 is formed with angled sidewalls, as shown in the cross-sectional view 1800 of FIG. 18. It will be appreciated that the angled sidewalls of the cavity 106 may angle inward toward one another (as shown in the cross-sectional view 1800 of FIG. 18) or may angle outward away from one another. In other embodiments, the cavity 106 is formed with substantially vertical sidewalls or rounded sidewalls.

By forming the cavity 106, the portion of the MEMS layer 108 disposed between the diaphragm openings 1302 is released from being affixed to the substrate 104, thereby forming a movable diaphragm 112 comprising the corrugated portion 116 of the MEMS layer 108 and the flat portion 114 of the MEMS layer 108. In other words, after the portion of the MEMS layer 108 disposed between the diaphragm openings 1302 is released, the portion of the MEMS layer 108 disposed between the diaphragm openings 1302 is referred to as the movable diaphragm 112 (e.g., because the movable diaphragm 112 is able to be displaced by the actuation device 132). The movable diaphragm 112 comprises first outer sidewalls 128. In some embodiments, the first outer sidewalls 128 of the movable diaphragm 112 correspond to sidewalls the diaphragm openings 1302 (e.g., sidewalls of the MEMS layer 108), respectively.

In some embodiments, a process for forming the cavity 106 comprises flipping (e.g., rotating 180 degrees) the structure illustrated in the cross-sectional view 1700 of FIG. 17. Thereafter, a patterned masking layer (not shown) (e.g., positive/negative photoresist, a hardmask, etc.) is formed on the back-side 104b of the substrate 104. With the patterned masking layer in place, an etching process is then performed on the substrate 104 and the first dielectric layer 110 to remove unmasked portions of the substrate 104 and the first dielectric layer 110, thereby forming the cavity 106. In other embodiments, the etching process may stop on the first dielectric layer 110 (e.g., the first dielectric layer 110 acts as an etch stop layer). In some embodiments, the etching process may be, for example, a wet etching process, a dry etching process, a RIE process, some other etching process, or a combination of the foregoing.

Because the second passivation layer 310 is formed lining the diaphragm openings 1302 and extending horizontally across the bottom surfaces of the diaphragm openings 1302 (see, e.g., FIG. 17), the second passivation layer 310 may, at least partially, support the movable diaphragm 112 so that the movable diaphragm 112 is suspended over (e.g., directly over) the cavity 106. In further embodiments, one or more tethers (not shown) (e.g., tethering portions of the MEMS layer 108) may, at least partially, support the movable diaphragm 112 so that the movable diaphragm 112 is suspended over (e.g., directly over) the cavity 106. In some embodiments, formation of the cavity 106 completes formation of the semiconductor device 102 (e.g., MEMS speaker). In some embodiments, after the cavity 106 is formed, the diaphragm openings 1302 may be referred to as gaps (e.g., gaps in the MEMS layer 108 that are disposed between the movable diaphragm 112 and affixed portions of the MEMS layer 108).

While not shown, it will be appreciated that after the cavity 106 is formed, the structure illustrated in the cross-sectional view 1800 of FIG. 18 may be flipped (e.g., rotated 180 degrees). Thereafter, an interconnect structure (e.g., an interlayer dielectric (ILD) structure having a metal interconnect disposed therein) may be formed over the MEMS layer 108 and the one or more actuation devices 132, such that the one or more actuation devices 132 may be electrically coupled to one or more I/O structures (e.g., bond pads, solder bumps, etc.).

FIG. 19 illustrates a flowchart 1900 of some embodiments of a method for forming a semiconductor device 102 with improved signal distortion. While the flowchart 1900 of FIG. 19 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

At act 1902, a plurality of corrugation trenches are formed in a substrate. FIG. 7 illustrates a cross-sectional view 700 of some embodiments corresponding to act 1902.

At act 1904, a microelectromechanical systems (MEMS) layer is formed over the substrate and at least partially in the plurality of corrugation trenches, wherein the MEMS layer comprises a flat portion and a corrugated portion. FIGS. 8-9 illustrate a series of cross-sectional views 800-900 of some embodiments corresponding to act 1904.

At act 1906, a dielectric layer is formed over the MEMS layer and the substrate. FIGS. 10-11 illustrate a series of cross-sectional views 1000-1100 of some embodiments corresponding to act 1906.

At act 1908, an actuation device is formed over the MEMS layer and the dielectric layer. FIG. 12 illustrates a cross-sectional view 1200 of some embodiments corresponding to act 1908.

At act 1910, diaphragm openings are formed in the MEMS layer, wherein the diaphragm openings are formed such that the corrugated portion of the MEMS layer and the flat portion of the MEMS layer are disposed between diaphragm openings. FIG. 13 illustrates a cross-sectional view 1300 of some embodiments corresponding to act 1910.

At act 1912, a cavity is formed in the substrate, wherein the cavity is formed such that the diaphragm openings are disposed between sidewalls of the cavity. FIGS. 14-18 illustrate a series of cross-sectional views 1400-1800 of some embodiments corresponding to act 1912.

In some embodiments, the present application provides a semiconductor device. The semiconductor device comprises a substrate. A cavity is disposed in the substrate. A microelectromechanical system (MEMS) layer is disposed over the substrate. The MEMS layer comprises a movable diaphragm disposed over the cavity. The movable diaphragm comprises a central region and a peripheral region. The movable diaphragm is flat in the central region of the movable diaphragm. The movable diaphragm is corrugated in the peripheral region of the movable diaphragm.

In some embodiments, the present application provides a semiconductor device. The semiconductor device comprises a substrate. A cavity is disposed in the substrate. A microelectromechanical system (MEMS) layer is disposed over the substrate. The MEMS layer comprises a movable diaphragm disposed over the cavity. The movable diaphragm has a flat portion and a corrugated portion. The corrugated portion of the movable diaphragm laterally surrounds the flat portion of the movable diaphragm.

In some embodiments, the present application provides a method for forming a semiconductor device. The method comprises forming a plurality of corrugation trenches in a substrate. A dielectric layer is formed over the substrate and lining the plurality of corrugation trenches. A microelectromechanical system (MEMS) layer is formed over the dielectric layer and in the plurality of corrugation trenches. A plurality of corrugation grooves are formed in the MEMS layer. Diaphragm openings are formed in the MEMS layer, wherein the diaphragm openings are formed such that the plurality of corrugation trenches and the plurality of corrugation grooves are disposed between the diaphragm openings. A cavity is formed in the substrate, wherein the cavity is formed such that the diaphragm openings are disposed between sidewalls of the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
a substrate having first and second inner sidewalls that define outer edges of a cavity when viewed in a cross-section of the semiconductor device;
a movable diaphragm suspended over the cavity when viewed in the cross-section, the movable diaphragm including a central region and first and second peripheral regions that couple the central region to the respective first and second inner sidewalls of the substrate,
wherein the first and second peripheral regions each include an upper surface with multiple grooves and multiple ridges when viewed in the cross-section,
wherein the central region has a uniform thickness defined between a flat upper surface of the central region and a flat lower surface of the central region when viewed in cross section, and wherein outermost edges of the central region have the uniform thickness, and wherein a lowermost point of a groove in the upper surface of the peripheral region is arranged on a plane that is parallel to an upper surface of the substrate and that traverses the central region between the flat upper surface and the flat lower surface.

2. The semiconductor device of claim 1, wherein the multiple ridges each include a flat upper surface and a flat lower surface, the flat upper surface of each ridge being level with the flat upper surface of the central region, and the flat lower surface of each ridge being level with the flat lower surface of the central region when viewed in the cross-section.

3. The semiconductor device of claim 1, wherein the multiple grooves each include a flat upper surface and a flat lower surface, the flat upper surface of each groove being disposed at a height that is between the flat upper surface of the central region and the flat lower surface of the central region, and the flat lower surface of each groove being at a height that is lower than the flat lower surface of the central region when viewed in the cross-section.

4. A semiconductor device, comprising:
a substrate;
a cavity disposed in the substrate;
a microelectromechanical system (MEMS) layer disposed over the substrate, wherein:
the MEMS layer comprises a movable diaphragm disposed over the cavity;
the movable diaphragm has a flat portion and a corrugated portion; and
the corrugated portion of the movable diaphragm laterally surrounds the flat portion of the movable diaphragm and comprises grooves and ridges that have upwardly facing surfaces and comprises inverted grooves and inverted ridges that have downwardly facing surfaces, wherein peaks of the ridges are flat surfaces that are co-planar with a top surface of the flat portion and the peaks of the inverted grooves are flat surfaces that are co-planar with a surface of the substrate.

5. The semiconductor device of claim 4, further comprising:
an actuation device disposed over the MEMS layer, wherein the actuation device is configured to displace the movable diaphragm in response to an electrical signal.

6. The semiconductor device of claim 5, wherein the actuation device comprises a piezoelectric structure disposed between an upper electrode and a lower electrode.

7. The semiconductor device of claim 4, wherein:
the corrugated portion of the movable diaphragm comprises alternating ridges and grooves; and
the grooves comprise angled sidewalls.

8. The semiconductor device of claim 7, wherein:
one of the ridges is spaced further from the flat portion than each of the other ridges; and
an outer sidewall of the movable diaphragm extends from an upper surface of the one of the ridges and is substantially vertical.

9. The semiconductor device of claim 7, wherein bottom surfaces of the grooves are substantially planar.

10. The semiconductor device of claim 9, wherein upper surfaces of the ridges are substantially planar.

11. The semiconductor device of claim 10, wherein the bottom surfaces of the grooves are disposed between an upper surface of the flat portion of the movable diaphragm and a bottom surface of the flat portion of the movable diaphragm.

12. A semiconductor device, comprising:
a substrate;
a cavity disposed in the substrate;
a microelectromechanical system (MEMS) layer disposed over the substrate, wherein:
the MEMS layer comprises a movable diaphragm disposed over the cavity;
the movable diaphragm comprises a central region and a peripheral region;
the movable diaphragm has a flat surface in the central region of the movable diaphragm;
the movable diaphragm is corrugated in the peripheral region of the movable diaphragm;
wherein the peripheral region has a top side and a bottom side that each comprise multiple grooves and multiple ridges, wherein the grooves and the ridges each comprise a flat surface that is parallel to the flat surface of the movable diaphragm;

an actuation device disposed over the MEMS layer, wherein:

the actuation device is configured to displace the movable diaphragm in response to an electrical signal; and wherein the peripheral region has a thickness defined between a bottommost point of a groove on its upper surface and a bottommost point of an inverted ridge on its lower surface, wherein the flat lower surface of the central region lies on a plane that is substantially parallel to an upper surface of the substrate that traverses the thickness of the peripheral region between those two bottommost points.

13. The semiconductor device of claim 12, wherein:

the actuation device comprises a piezoelectric structure disposed between an upper electrode and a lower electrode; and further comprising:

a passivation layer disposed over the actuation device and the movable diaphragm, wherein the passivation layer lines the MEMS layer in both the central region of the movable diaphragm and the peripheral region of the movable diaphragm.

14. The semiconductor device of claim 12, wherein:

the peripheral region of the movable diaphragm comprises a first portion of the peripheral region and a second portion of the peripheral region; and the first portion of the peripheral region and the second portion of the peripheral region are disposed on opposite sides of the central region of the movable diaphragm.

15. The semiconductor device of claim 14, wherein:

the first portion of the peripheral region, the second portion of the peripheral region, and the central region of the movable diaphragm extend continuously between first opposite sidewalls of the movable diaphragm; and the central region of the movable diaphragm laterally separates the first portion of the peripheral region from the second portion of the peripheral region.

16. The semiconductor device of claim 15, wherein:

the movable diaphragm has second opposite sidewalls;

the second opposite sidewalls of the movable diaphragm are spaced apart in a first direction;

the first opposite sidewalls of the movable diaphragm are spaced apart in a second direction that is perpendicular to the first direction;

the first portion of the peripheral region extends laterally from the central region to one of the second opposite sidewalls of the movable diaphragm; and the second portion of the peripheral region extends laterally from the central region to another one of the second opposite sidewalls of the movable diaphragm.

17. The semiconductor device of claim 12, wherein the peripheral region of the movable diaphragm extends laterally around the central region of the movable diaphragm in a closed loop path.

18. The semiconductor device of claim 17, wherein the peripheral region of the movable diaphragm is a continuous region that extends laterally from the central region to outer sidewalls of the movable diaphragm.

19. The semiconductor device of claim 18, wherein:

the one or more grooves and the one or more ridges alternate from the central region of the movable diaphragm to the outer sidewalls of the movable diaphragm.

20. The semiconductor device of claim 19, wherein the one or more grooves and the one or more ridges are concentric.

* * * * *